US011164888B2

(12) United States Patent
Futatsuyama et al.

(10) Patent No.: US 11,164,888 B2
(45) Date of Patent: Nov. 2, 2021

(54) SEMICONDUCTOR MEMORY DEVICE

(71) Applicant: TOSHIBA MEMORY CORPORATION, Tokyo (JP)

(72) Inventors: Takuya Futatsuyama, Yokohama Kanagawa (JP); Go Shikata, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/030,776

(22) Filed: Sep. 24, 2020

(65) Prior Publication Data
US 2021/0013227 A1 Jan. 14, 2021

Related U.S. Application Data

(63) Continuation of application No. 16/356,967, filed on Mar. 18, 2019, now Pat. No. 10,825,829, which is a continuation of application No. 15/909,906, filed on Mar. 1, 2018, now Pat. No. 10,269,828.

(30) Foreign Application Priority Data

Mar. 27, 2017 (JP) .................................. 2017-061208
Sep. 1, 2017 (JP) .............................. JP2017-168249

(51) Int. Cl.
H01L 27/11582 (2017.01)
H01L 27/11565 (2017.01)
(Continued)

(52) U.S. Cl.
CPC ........ H01L 27/11582 (2013.01); G11C 16/10 (2013.01); G11C 16/24 (2013.01);
(Continued)

(58) Field of Classification Search
None
See application file for complete search history.

(56) References Cited

U.S. PATENT DOCUMENTS 8,250,437 B2   8/2012  Sakurada et al.
9,165,924 B2  10/2015  Cho et al.
(Continued)

FOREIGN PATENT DOCUMENTS

CN   101764096 A   6/2010
CN   102959693 A   3/2013
(Continued)

OTHER PUBLICATIONS

Lue et al. "A Novel Double-density, Single-Gate Vertical Channel (SGVC) 3D NAND Flash That Is Tolerant to Deep Vertical Etching CD Variation and Possesses Robust Read-disturb Immunity," IEEE International Electron Devices Meeting (IEDM), Washington, DC, USA, Dec. 7-9, 2015, pp. 3.2.1-3.2.4 (4 pages).
(Continued)

Primary Examiner — James G Norman
(74) Attorney, Agent, or Firm — Kim & Stewart LLP

(57) ABSTRACT

A semiconductor memory device includes wirings arranged in parallel along a first direction, the wirings including first and second wirings that are adjacent and a third wiring adjacent to the second wiring, a first pillar between the first and second wirings and a second pillar between the second and third wirings, the first and second pillars each extending in a second direction crossing the first direction toward the semiconductor substrate, and first and second bit lines connected to the first and second pillars, respectively. A first voltage is applied to the second wiring during a program operation on a first memory cell at an intersection of the second wiring and the first pillar, and a second voltage higher than the first voltage is applied to the second wiring during a program operation on a second memory cell at an intersection of the second wiring and the second pillar.

16 Claims, 27 Drawing Sheets

(51) Int. Cl.
  *H01L 27/1157* (2017.01)
  *G11C 16/10* (2006.01)
  *G11C 16/26* (2006.01)
  *G11C 16/24* (2006.01)
  *H01L 21/28* (2006.01)
  *G11C 16/08* (2006.01)
  *G11C 16/04* (2006.01)
  *G11C 11/56* (2006.01)

(52) U.S. Cl.
  CPC .......... *G11C 16/26* (2013.01); *H01L 27/1157* (2013.01); *H01L 27/11565* (2013.01); *H01L 29/40117* (2019.08); *G11C 11/5671* (2013.01); *G11C 16/0483* (2013.01); *G11C 16/08* (2013.01)

(56) References Cited

U.S. PATENT DOCUMENTS

| | | | |
|---|---|---|---|
| 9,324,446 | B2 | 4/2016 | Hishida et al. |
| 9,397,110 | B2 | 7/2016 | Lue |
| 2015/0340369 | A1* | 11/2015 | Lue .............. H01L 27/1157 365/185.03 |
| 2016/0260732 | A1 | 9/2016 | Lue |
| 2016/0315097 | A1 | 10/2016 | Hsu |
| 2017/0012053 | A1 | 1/2017 | Sun et al. |
| 2017/0062456 | A1 | 3/2017 | Sugino et al. |
| 2017/0271021 | A1 | 9/2017 | Futatsuyama et al. |

FOREIGN PATENT DOCUMENTS

| | | |
|---|---|---|
| CN | 104658602 A | 5/2015 |
| JP | 2017168163 A | 9/2017 |
| KR | 20130044706 A | 5/2013 |
| KR | 20130076458 A | 7/2013 |
| WO | 2016154597 A1 | 9/2016 |
| WO | 2017039780 A1 | 3/2017 |

OTHER PUBLICATIONS

Chinese Office Action dated Apr. 21, 2021, mailed in counterpart Chinese Application No. 201711135070.8, 11 pages (with translation).

* cited by examiner

SEMICONDUCTOR MEMORY DEVICE

CROSS-REFERENCE TO RELATED APPLICATIONS

This application is a continuation of U.S. patent application Ser. No. 16/356,967, filed on Mar. 18, 2019, which is a continuation of U.S. patent application Ser. No. 15/909,906, filed on Mar. 1, 2018, now U.S. Pat. No. 10,269,828, granted on Apr. 23, 2019, which is based upon and claims the benefit of priority from Japanese Patent Application No. 2017-061208, filed Mar. 27, 2017, and Japanese Patent Application No. 2017-168249, filed Sep. 1, 2017, the entire contents of each of which are incorporated herein by reference.

FIELD

Embodiments described herein relate generally to a semiconductor memory device.

BACKGROUND

Semiconductor memories in which memory cells are arranged three-dimensionally, are known.

DETAILED DESCRIPTION

Figure 1:
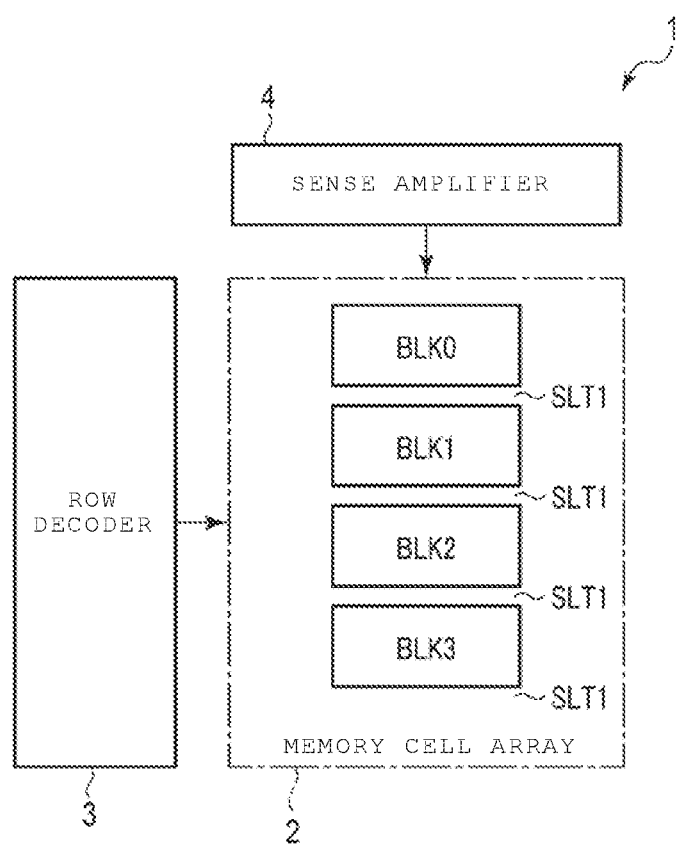
FIG. 1 is a block diagram of a semiconductor memory device according to a first embodiment.

Embodiments provide a semiconductor memory device capable of improving operational reliability.

In general, according to one embodiment, there is provided a semiconductor memory device including a plurality of wirings at a same level above a semiconductor substrate, that are arranged in parallel with each other along a first direction, the wirings including first and second wirings that are adjacent and a third wiring that is adjacent to the second wiring, a first pillar between the first and second wirings and a second pillar between the second and third wirings, the first and second pillars each extending in a second direction crossing the first direction toward the semiconductor substrate, and a first bit line connected to the first pillar and a second bit line connected to the second pillar. A first program voltage is applied to the second wiring during a program operation performed on a first memory cell at an intersection of the second wiring and the first pillar, and a second program voltage higher than the first program voltage is applied to the second wiring during a program operation performed on a second memory cell at an intersection of the second wiring and the second pillar.

Hereinafter, embodiments will be described with reference to the drawings. In the description presented below, a common reference numeral will be given to elements having the same function and the same configuration.

1. First Embodiment

A memory system according to a first embodiment will be described. Hereinafter, a memory system including a NAND flash memory as a semiconductor memory device will be described as an example.

1.1 Configuration

The configuration of a NAND flash memory according to this embodiment will be described.

1.1.1 Entire Configuration

First, the entire configuration of the NAND flash memory according to this embodiment will be described with reference to FIG. 1.

As illustrated in the drawing, the NAND flash memory 1 includes a memory cell array 2, a row decoder 3, and a sense amplifier 4.

The memory cell array 2 includes a plurality of blocks BLK. While only four blocks BLK0 to BLK3 are illustrated in FIG. 1, the number of the blocks is not particularly limited. Each of the blocks BLK includes a plurality of memory cells that are three-dimensionally stacked in association with a row and a column. The blocks BLK are disposed on a semiconductor substrate, and a slit SLT1 is formed between the blocks adjacent to each other. Details of the configuration of the memory cell array 2 will be described later.

The row decoder 3 decodes a row address received from the outside. Then, the row decoder 3 selects a row direction of the memory cell array 2 based on a result of the decoding. More specifically, the row decoder 3 applies voltages to various wirings used for selecting the row direction.

The sense amplifier 4 senses data read from one block BLK when data is to be read. In addition, the sense amplifier 4 applies a voltage corresponding to write data to the memory cell array 2 when data is to be written.

1.1.2 Configuration of Memory Cell Array 2

Next, the configuration of the memory cell array 2 according to this embodiment will be described.

<Circuit Configuration>

Figure 2:
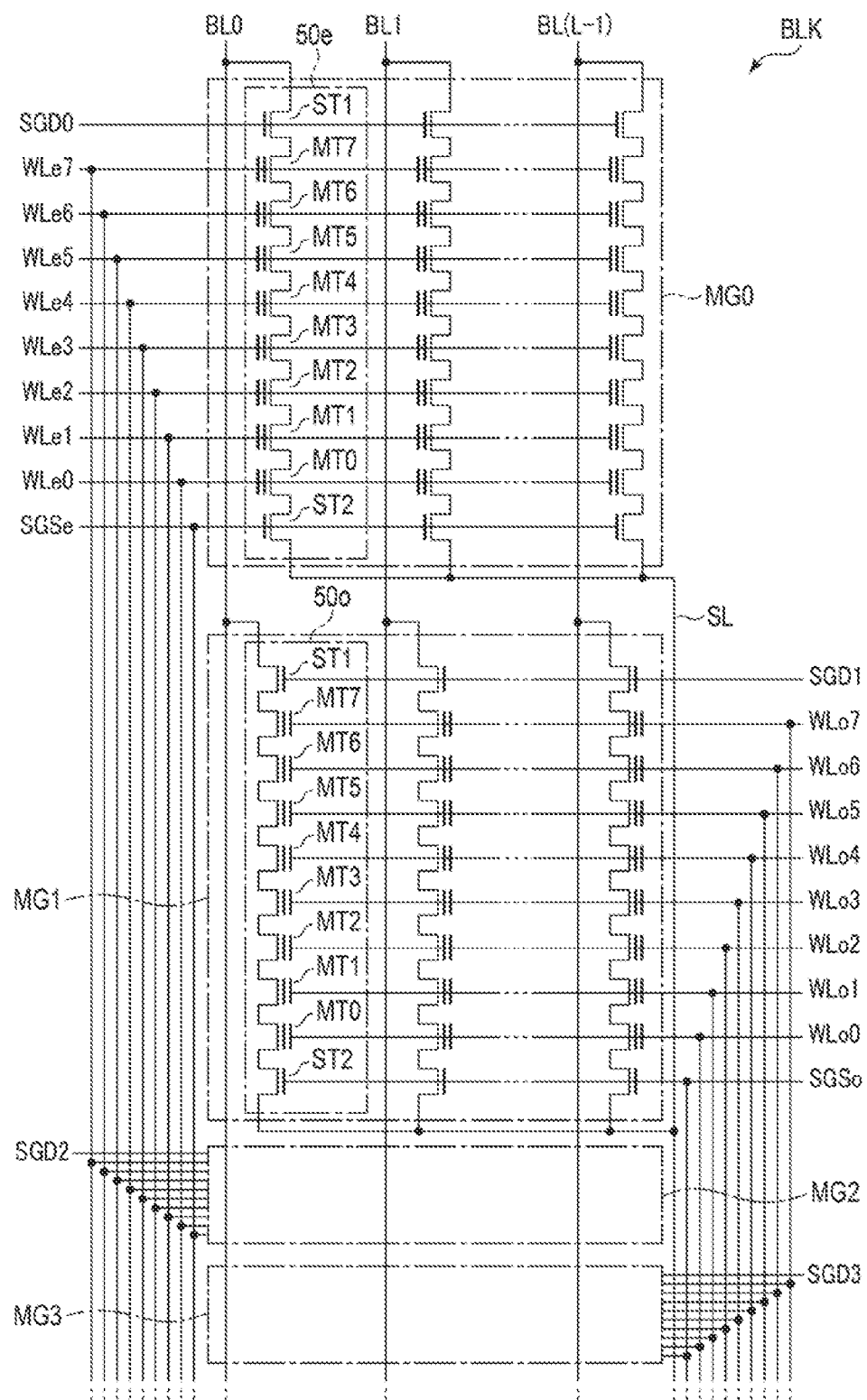
FIG. 2 is a circuit diagram of a memory cell array according to the first embodiment.

First, the circuit configuration of the memory cell array 2 will be described with reference to FIG. 2. FIG. 2 is an equivalent circuit diagram of a block BLK. As illustrated in the drawing, the block BLK includes a plurality of memory groups MG (MG0, MG1, MG2, . . . ). Each memory group MG includes a plurality of NAND strings 50. Hereinafter, a NAND string of an even-numbered memory group MGe (MG0, MG2, MG4, . . . ) will be referred to as a NAND string 50e, and a NAND string of an odd-numbered memory group MGo (MG1, MG3, MG5, . . . ) will be referred to as a NAND string 50o.

Each NAND string 50 includes, for example, eight memory cell transistors MT (MT0 to MT7) and selection transistors ST1 and ST2. Each memory cell transistor MT includes a control gate, a charge storage layer, and the like and stores data in a nonvolatile manner. The memory cell transistor MT is connected in series between a source of the selection transistor ST1 and a drain of a selection transistor ST2.

The gates of the selection transistors ST1 of each memory group MGe are connected to a select gate line SGD (SGD0, SGD1, . . . ). The select gate lines SGD are independently controlled by the row decoder 3. The gates of the selection transistors ST2 of each even-numbered memory group MGe (MG0, MG2, . . . ), for example, are connected in common to a select gate line SGSe, and the gates of the selection transistors ST2 of each odd-numbered memory group MGo (MG1, MG3, . . . ), for example, are connected in common to a select gate line SGSo. The select gate lines SGSe and SGSo, for example, may be commonly connected or not so as to be independently controllable.

The control gates of the memory cell transistors MT (MT0 to MT7) provided in a memory group MGe inside a same block BLK are commonly connected to word lines WLe (WLe0 to WLe7) respectively. On the other hand, the control gates of the memory cell transistors MT (MT0 to MT7) provided in a memory group MGo are commonly connected to word lines WLo (WLo0 to WLo7) respectively. The select gate lines WLe and WLo are independently controlled by the row decoder 3.

A block BLK is, for example, a unit for erasing data. In other words, data stored by memory cell transistors MT provided in a same block BLK is erased collectively.

In addition, within the memory cell array 2, drains of the selection transistors ST1 of the NAND strings 50 disposed in a same column are commonly connected to a bit line BL (BL0 to BL(L−1) (here, (L−1) is a natural number of two or more)). In other words, a bit line BL connects the NAND strings 50 in common across a plurality of memory groups MG. Furthermore, sources of a plurality of selection transistors ST2 are connected in common to the source line SL.

In other words, the memory group MG includes the plurality of NAND strings 50 that are connected to different bit lines BL and are connected to the same select gate line SGD. In addition, the block BLK includes a plurality of memory groups MG having word lines WL in common. The memory cell array 2 includes a plurality of blocks BLK having the bit lines BL in common. Within the memory cell array 2, the select gate line SGS, the word line WL, and the select gate line SGD are stacked above the semiconductor substrate, whereby the memory cell transistors MT are three-dimensionally stacked.

<Planar Layout of Memory Cell Array>

Figure 3:
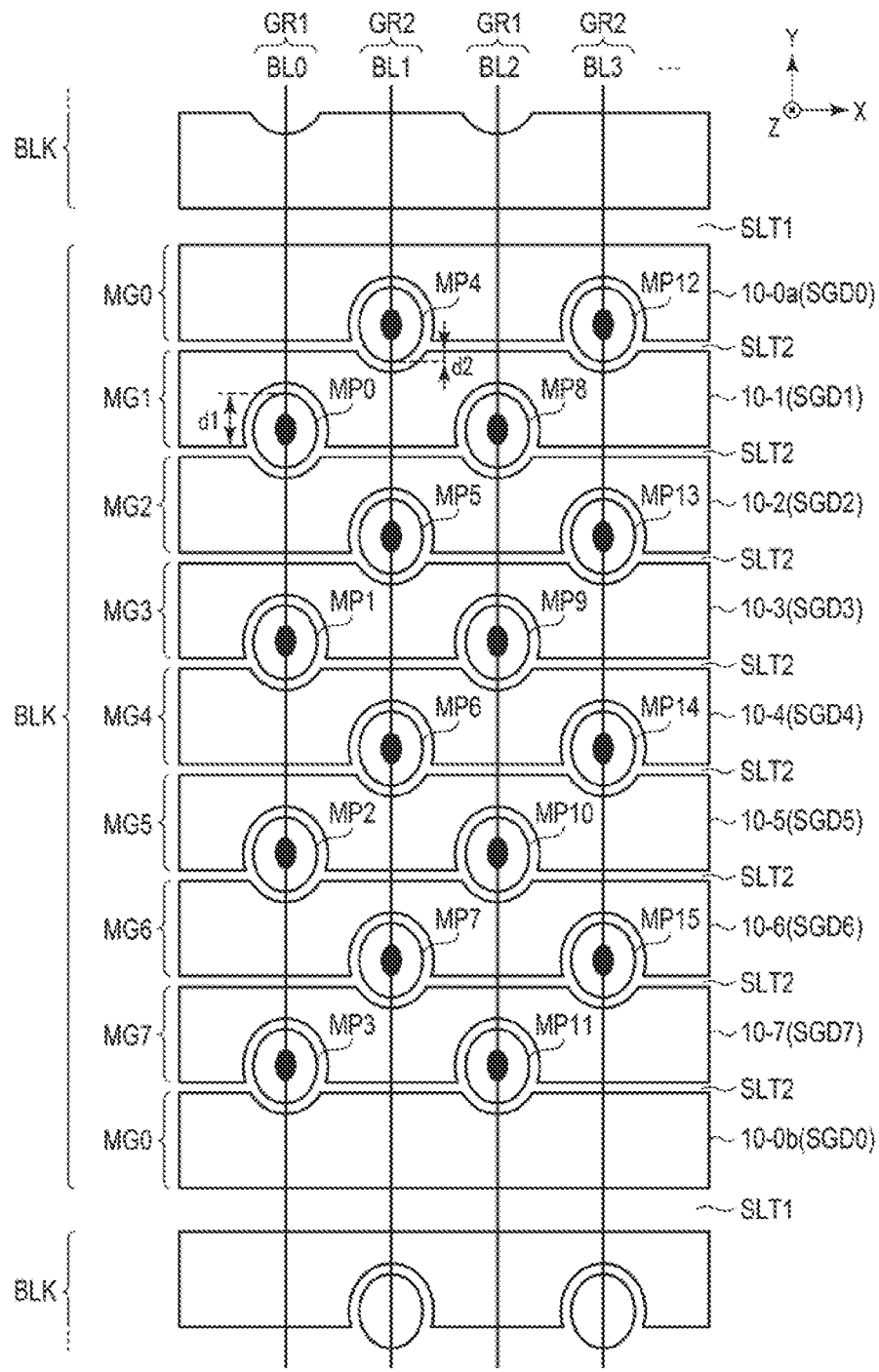
FIG. 3 is a planar layout of a select gate line according to the first embodiment.

Next, the planar configuration of the memory cell array 2 will be described. FIG. 3 illustrates a planar layout of select gate lines SGD of a certain block BLK inside a semiconductor substrate plane (this will be referred to as an XY plane). In this example, a case where eight select gate lines SGD are provided within one block BLK will be described.

As illustrated in the drawing, nine conductive layers 10 (10-0 to 10-7; here, 10-0 includes 10-0a and 10-0b) extending in an X direction are arranged in a Y direction orthogonal to the X direction. Each conductive layer 10 functions as a select gate line SGD. In the example illustrated in FIG. 3, within the block BLK, two wiring layers 10-0a and 10-0b positioned at both ends in the Y direction function as a select gate line SGD0. In other words, two wiring layers 10 positioned at both ends in the Y direction are connected in common to be controlled by the row decoder 3 in the same manner. Seven wiring layers 10-1 to 10-7 interposed therebetween respectively function as select gate lines SGD1 to SGD7. Accordingly, when seen in the XY plane within the block BLK, memory groups MG1 to MG7 are arranged in the Y direction, and a memory group MG0 is disposed on both sides thereof.

Within the block BLK, wiring layers 10 adjacent to each other in the Y direction are separated from each other by an insulating film not illustrated in the drawing. A region in which this insulating film is disposed is called a slit SLT2. In the slit SLT2, the insulating film is embedded, for example, in regions of the semiconductor substrate plane at least up to a layer in which the wiring layer 10 is disposed. In addition, within the memory cell array 2, the plurality of blocks BLK illustrated in FIG. 3 are arranged, for example, in the Y direction. The blocks BLK adjacent in the Y direction are separated from each other by an insulating film not illustrated in the drawing. A region in which this insulating film is disposed is the slit SLT1 described with reference to FIG. 1. The slit SLT1 is similar to the slit SLT2.

Furthermore, between the wiring layers 10 adjacent in the Y direction, a plurality of memory pillars MP (MP0 to MP15) extending along a Z direction are disposed. The Z direction is a direction orthogonal to the X and Y directions, in other words, is a direction perpendicular to the semiconductor substrate plane.

More specifically, memory pillars MP0 and MP8 are disposed between the wiring layers 10-1 and 10-2, memory pillars MP1 and MP9 are disposed between the wiring layers 10-3 and 10-4, memory pillars MP2 and MP10 are disposed between the wiring layers 10-5 and 10-6, and memory pillars MP3 and MP11 are disposed between the wiring layers 10-7 and 10-0b. The memory pillar MP is a structural element forming the selection transistors ST1 and ST2 and the memory cell transistor MT, and details thereof will be described later.

The memory pillars MP0 to MP3 are arranged in the Y direction. The memory pillars MP8 to MP11 are adjacent to the memory pillars MP0 to MP3 in the X direction and are arranged in the Y direction. In other words, the memory pillars MP0 to MP3 and the memory pillars MP8 to MP11 arranged in parallel with respect to each other.

A bit line BL0 is disposed above the wiring layer 10 to be commonly connected to the memory pillars MP0 to MP3. In addition, a bit line BL2 is disposed above the wiring layer 10 to be commonly connected to the memory pillars MP8 to MP11. Hereinafter, the memory pillars MP0 to MP3, the memory pillars MP8 to MP11, and the bit lines BL0 and BL2 may be referred to as a group GR1.

In addition, memory pillars MP4 and MP12 are disposed between the wiring layers 10-0a and 10-1, memory pillars MP5 and MP13 are disposed between the wiring layers 10-2 and 10-3, memory pillars MP6 and MP14 are disposed between the wiring layers 10-4 and 10-5, and memory pillars MP7 and MP15 are disposed between the wiring layers 10-6 and 10-7.

The memory pillars MP4 to MP7 are arranged in the Y direction, and the memory pillars MP12 to MP15 are arranged in the Y direction as well. The memory pillars MP4 to MP7 are positioned between the memory pillars MP0 to MP3 and the memory pillars MP8 to MP11 in the X direction. In addition, the memory pillars MP12 to MP15 and the memory pillars MP4 to MP7 are positioned to have the memory pillars MP8 to MP11 interposed therebetween in the X direction. In other words, the memory pillars MP4 to MP7 and the memory pillars MP12 to MP15 are arranged in parallel with respect to each other.

A bit line BL1 is disposed above the wiring layer 10 to be commonly connected to the memory pillars MP4 to MP7. In addition, a bit line BL3 is disposed above the wiring layer 10 to be commonly connected to the memory pillars MP12 to MP15. Hereinafter, the memory pillars MP4 to MP7, the memory pillars MP12 to MP15, and the bit lines BL1 and BL3 may be referred to as a group GR2.

In other words, the memory pillars MP are disposed to straddle two wiring layers 10 in the Y direction and to be embedded in a part of the slit SLT2, and two memory pillars MP adjacent to each other in the Y direction are present in one slit SLT2. The slit SLT2 in which the memory pillars MP belonging to the group GR1 are embedded is positioned between two memory pillars MP belonging to the group GR2, and the slit SLT2 in which the memory pillars MP belonging to the group GR2 are embedded is positioned between two memory pillars MP belonging to the group GR1.

In addition, no memory pillar MP is disposed between the wiring layers 10-0a and 10-0b that are adjacent to each other with the slit SLT1 interposed therebetween.

Figure 4:
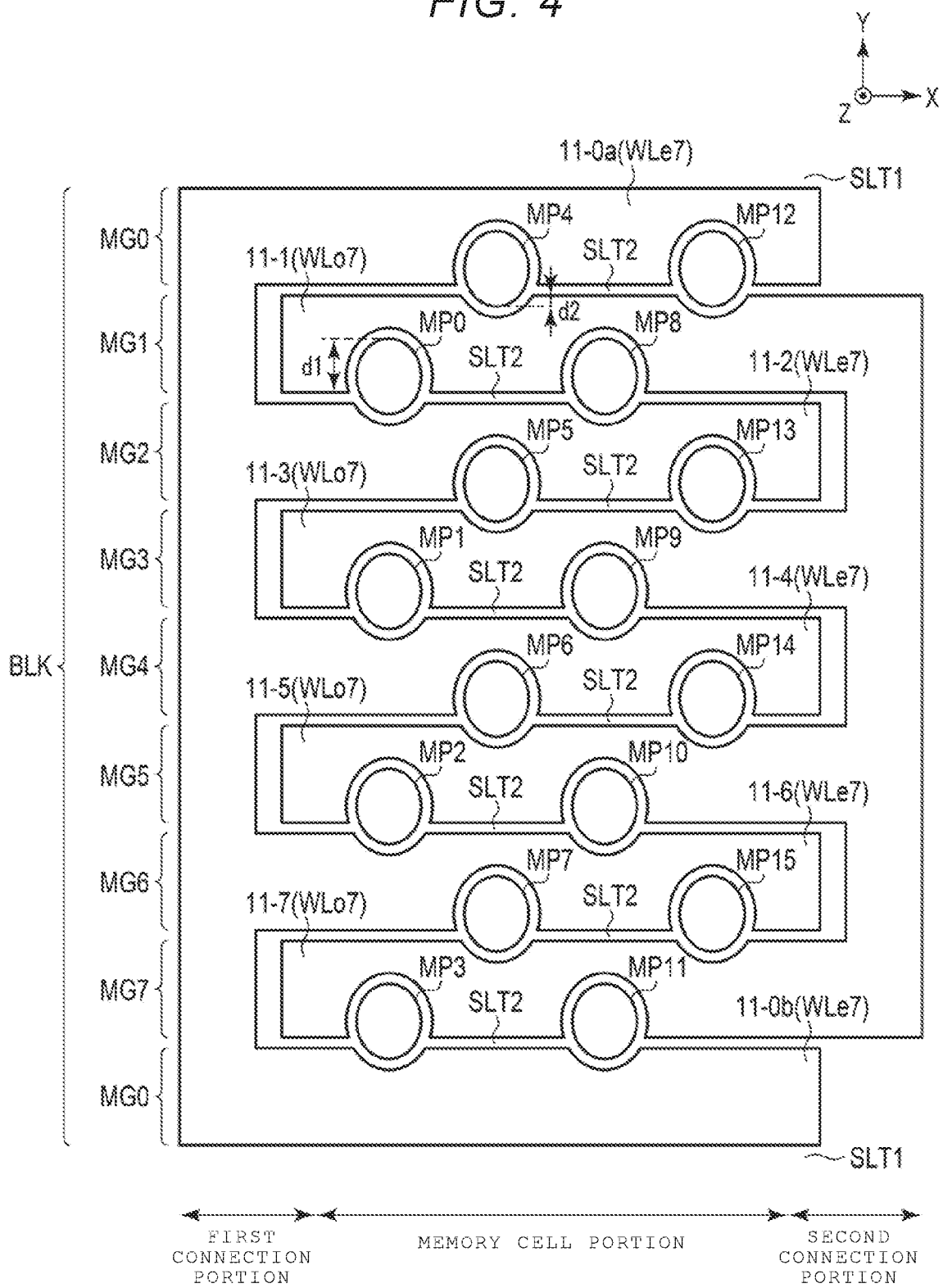
FIG. 4 is a planar layout of a word line according to the first embodiment.

FIG. 4, similar to FIG. 3, illustrates a planar layout of word lines WL in the XY plane. FIG. 4 corresponds to a region corresponding to one block illustrated in FIG. 3 and is a layout of the wiring layer 11 disposed in a lower layer than the wiring layer 10 described with reference to FIG. 3.

As illustrated in the drawing, nine conductive layers 11 (11-0 to 11-7; here 11-0 includes 11-0a and 11-0b) extending in the X direction are arranged in the Y direction. The wiring layers 11-0 to 11-7 are respectively disposed right below the wiring layers 10-0 to 10-7 with an insulating film in between.

Each conductive layer 10 functions as a word line WL7. The other word lines WL0 to WL6 have the same structure as the word line WL7. In the example illustrated in FIG. 4, the wiring layers 11-0a, 11-2, 11-4, 11-6, and 11-0b function as a word line WLe7. Such wiring layers 11-0a, 11-2, 11-4, 11-6, and 11-0b are drawn out up to an end portion (this will be referred to as a first connection portion) in the X direction and are commonly connected to each other. In the first connection portion, the wiring layers 11-0a, 11-2, 11-4, 11-6, and 11-0b are connected to the row decoder 3.

In addition, the wiring layers 11-1, 11-3, 11-5, and 11-7 function as a word line WLo7. Such wiring layers 11-1, 11-3, 11-5, and 11-7 are drawn out up to a second connection portion positioned on a side opposite to the first connection portion in the X direction and are commonly connected to each other. In the second connection portion, the wiring layers 11-1, 11-3, 11-5, and 11-7 are connected to the row decoder 3.

A memory cell portion is disposed between the first connection portion and the second connection portion. In the memory cell portion, the wiring layers 11 adjacent to each other in the Y direction are separated from each other by the slit SLT2 described with reference to FIG. 3. In addition, the wiring layers 11 between the blocks BLK adjacent to each other in the Y direction are similarly separated from each other by the slit SLT1. In addition, in the memory cell portion, similar to FIG. 3, memory pillars MP0 to MP15 are disposed.

The configuration described above is similar also in a layer in which the other word lines WL and the select gate lines SGS are formed.

<Cross-Sectional Structure of Memory Cell Array>

Figure 5:
FIG. 5 is a cross-sectional view of a block according to the first embodiment.

Next, the cross-sectional structure of the memory cell array 2 will be described. FIG. 5 is a cross-sectional view of the block BLK taken in the Y direction and illustrates a cross-sectional structure of a region extending along the bit line BL0 in FIG. 3 as an example.

As illustrated in the drawing, above a semiconductor substrate (for example, a p-type well region) 13, a wiring layer 12 functioning as a select gate line SGS is disposed. Above the wiring layer 12, wiring layers 11 of eight layers functioning as word lines WL0 to WL7 are stacked in the Z direction. FIG. 4 illustrates the planar layout of such wirings 11 and 12. Above the wiring layer 11, a wiring layer 10 functioning as a select gate line SGD is disposed. The planar layout of the wiring layer 10 is as described with reference to FIG. 3.

From the wiring layer 10 to the semiconductor substrate 13, the slit SLT2 and the memory pillar MP are alternately disposed in the Y direction. As described above, the actual form of the slit SLT2 is an insulating film. A contact plug used for applying a voltage to a region disposed inside the semiconductor substrate 13 and the like may be disposed inside the slit SLT2. For example, a contact plug used for connecting the source of the selection transistor ST2 to a source line may be disposed therein.

The wiring layers 12 include alternate arrangements of the select gate lines SGSo and SGSe with the slit SLT2 or the memory pillar MP interposed therebetween. Similarly, the wiring layers 11 include alternate arrangements of the word lines WLo and WLe with the slit SLT2 or the memory pillar MP interposed therebetween.

In addition, the slit SLT1 is disposed between the blocks BLK adjacent to each other in the Y direction. As described above, the actual form of the slit SLT1 is an insulating film. A contact plug used for applying a voltage to a region disposed inside the semiconductor substrate 13 and the like may be disposed inside the slit SLT1. For example, a contact plug used for connecting the source of the selection transistor ST2 to a source line or a groove-shaped conductor may be disposed therein. The width of the slit SLT1 in the Y direction is larger than the width of the slit SLT2 in the Y direction.

On the memory pillar MP, a contact plug 16 is disposed, and the wiring layer 15 functioning as the bit line BL extends in the Y direction to be commonly connected to each of such contact plugs 16.

Figure 6:
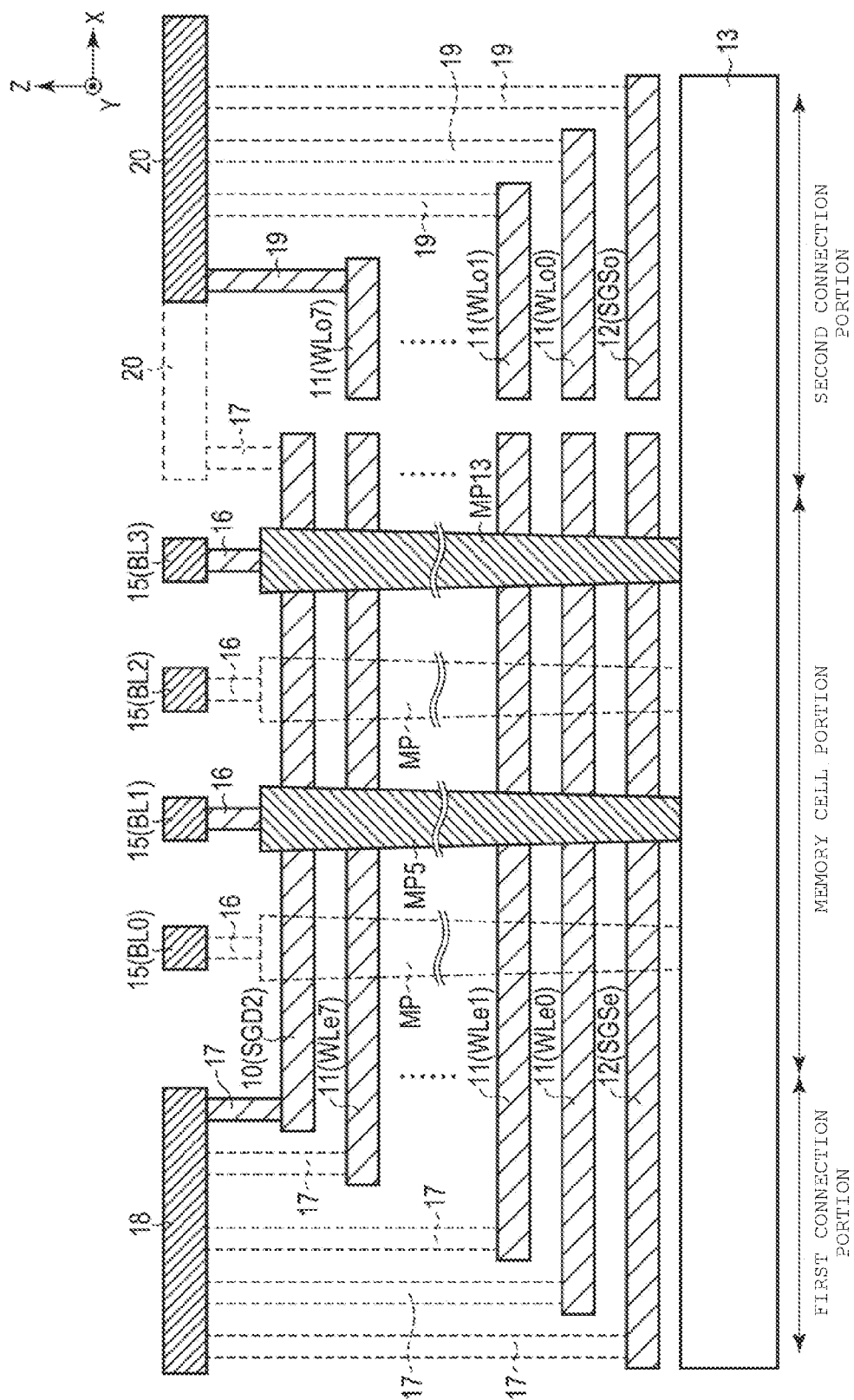
FIG. 6 is a cross-sectional view of a block according to the first embodiment.

FIG. 6 is a cross-sectional view of the block BLK taken along the X direction and illustrates a cross-sectional structure of a region extending along the select gate line SGD2 illustrated in FIG. 3 and passing through the memory pillars MP5 and MP13 as an example. As described with reference to FIG. 5, above the semiconductor substrate 13, wiring layers 12, 11, and 10 are sequentially disposed. The memory cell portion is as described with reference to FIG. 5.

In a first connection portion, wiring layers 10 to 12 are drawn out, for example, in a stair shape. In other words, when seen in the XY plane, upper faces of end portions of the wiring layers 11 of seven layers and the wiring layer 12 are exposed in the first connection portion. Contact plugs 17 are disposed on this exposed region, and the contact plugs 17 are connected to a metal wiring layer 18. By using this metal wiring layer 18, the wiring layers 10 to 12 functioning as the even-numbered select gate lines SGD0, SGD2, SGD4, and SGD6, the odd-numbered word lines WLo and the odd-numbered select gate lines SGSo are electrically connected to the row decoder 3.

On the other hand, in a second connection portion, similarly, the wiring layers 10 to 12 are drawn out, for example, in a stair shape. Contact plugs 19 are disposed on an exposed area of the wiring layers 10 to 12, and the contact plugs 19 are connected to a metal wiring layer 20. By using this metal wiring layer 20, the wiring layers 10 to 12 functioning as the odd-numbered select gate lines SGD1, SGD3, SGD5, and SGD7, the even-numbered word lines WLe, and the even-numbered select gate lines SGSe are electrically connected to the row decoder 3. In addition, the wiring layer 10 may be electrically connected to the row decoder 3 through the second connection portion instead of the first connection portion or through both the first connection portion and the second connection portion.

<Structure of Memory Pillar and Memory Cell Transistor>

Next, the structures of the memory pillar MP and the memory cell transistor MT will be described.

First Example

Figure 7:
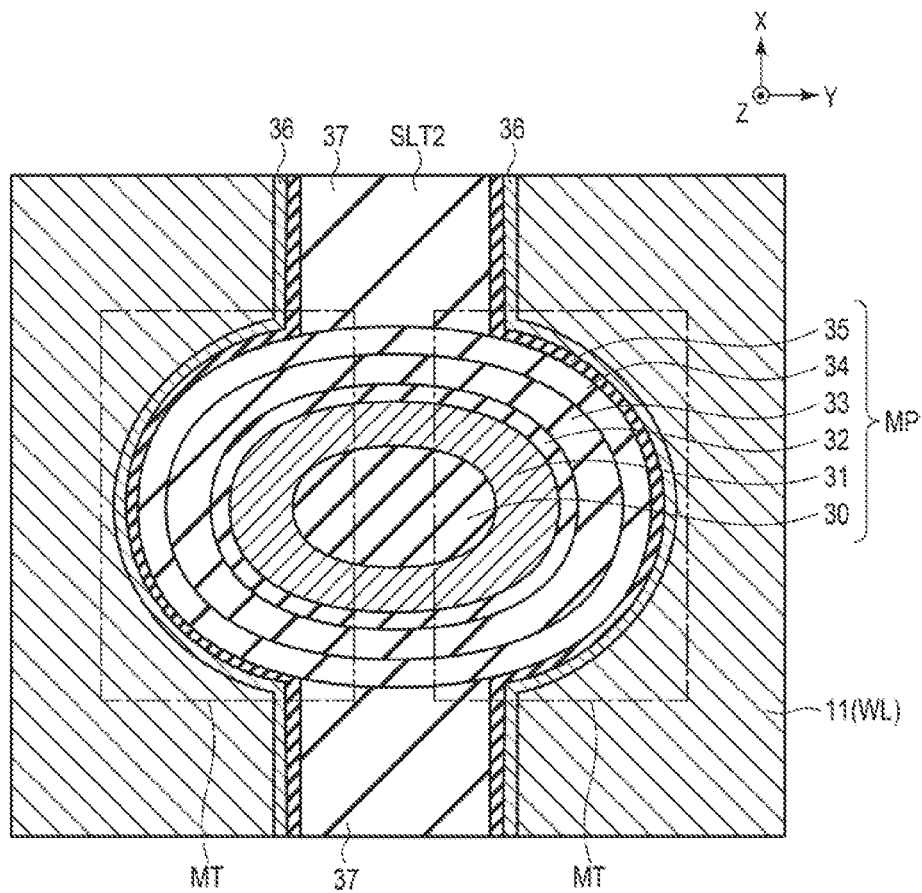
FIG. 7 is a cross-sectional view of a memory cell transistor according to the first embodiment.
Figure 8:
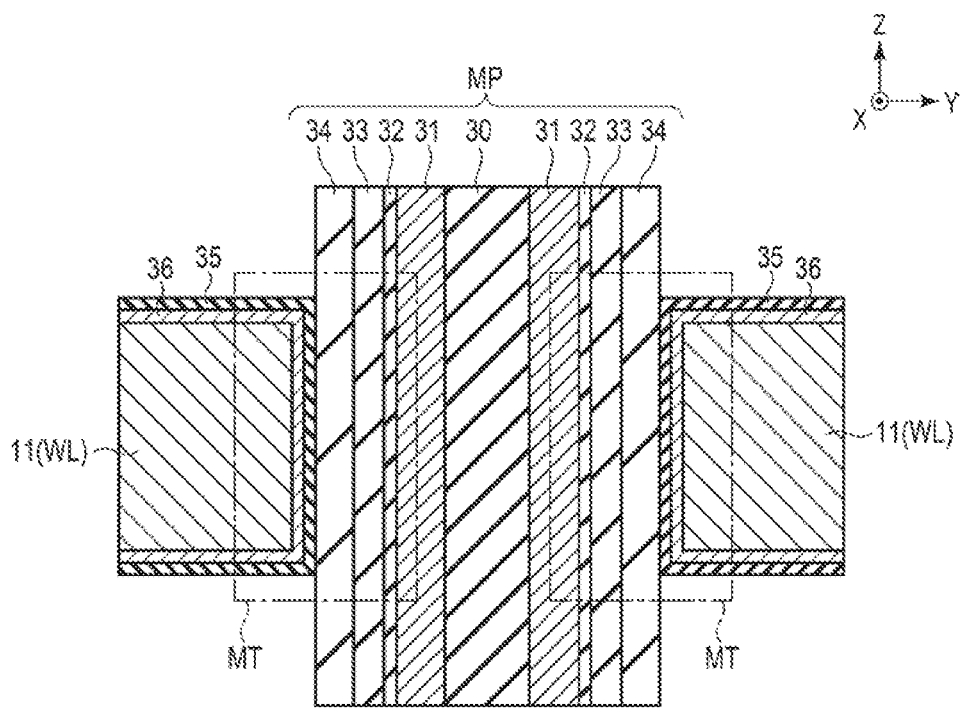
FIG. 8 is a cross-sectional view of the memory cell transistor according to the first embodiment.

First, a first example will be described with reference to FIGS. 7 and 8. FIG. 7 is a cross-sectional view of the memory pillar MP in a XY plane, and FIG. 8 is a cross-sectional view in an YZ plane and particularly illustrates an area in which two memory cell transistors MT are disposed. In the first example, an insulating film is used for the charge storage layer of the memory cell transistor MT.

As illustrated in the drawing, the memory pillar MP includes an insulating layer 30 disposed in the Z direction, a semiconductor layer 31, and insulating layers 32 to 34. The insulating layer 30 is, for example, a silicon oxide film. The semiconductor layer 31 is disposed to surround the periphery of the insulating layer 30 and functions as an area in which a channel of the memory cell transistor MT is formed. The semiconductor layer 31 is, for example, a polycrystalline silicon layer. The insulating layer 32 is disposed to surround the periphery of the semiconductor layer 31 and functions as a gate insulating film of the memory cell transistor MT. The insulating layer 32, for example, has a stacked structure of a silicon oxide film and a silicon nitride film. The insulating layer 33 is disposed to surround the periphery of the semiconductor layer 31 and functions as a charge storage layer of the memory cell transistor MT. The insulating layer 33, for example, is a silicon nitride film. The insulating layer 34 is disposed to surround the periphery of the insulating layer 33 and functions as a block insulating film of the memory cell transistor MT. The insulating layer 34, for example, is a silicon oxide film. Inside the slit SLT2 except for the memory pillar MP portion, the insulating layer 37 is embedded. The insulating layer 37, for example, is a silicon oxide film.

On the periphery of the memory pillar MP, for example, an AlO layer 35 is disposed. On the periphery of the AlO layer 35, for example, a barrier metal layer (TiN film or the like) 36 is formed. On the periphery of the barrier metal layer 36, a conductive layer 11 functioning as a word line WL is disposed. The conductive layer 11, for example, uses tungsten as its material.

According to the configuration described above, inside one memory pillar MP, two memory cell transistors MT are disposed in the Y direction. The selection transistor ST1 and ST2 have similar configurations.

Second Example

Figure 9:
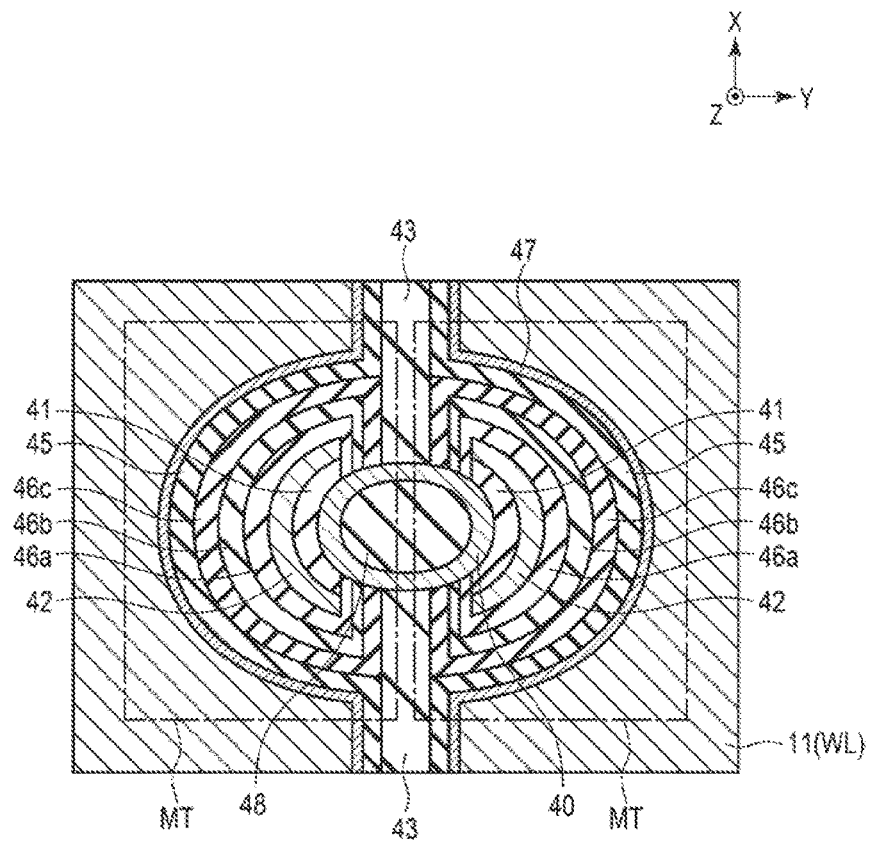
FIG. 9 is a cross-sectional view of the memory cell transistor according to the first embodiment.
Figure 10:
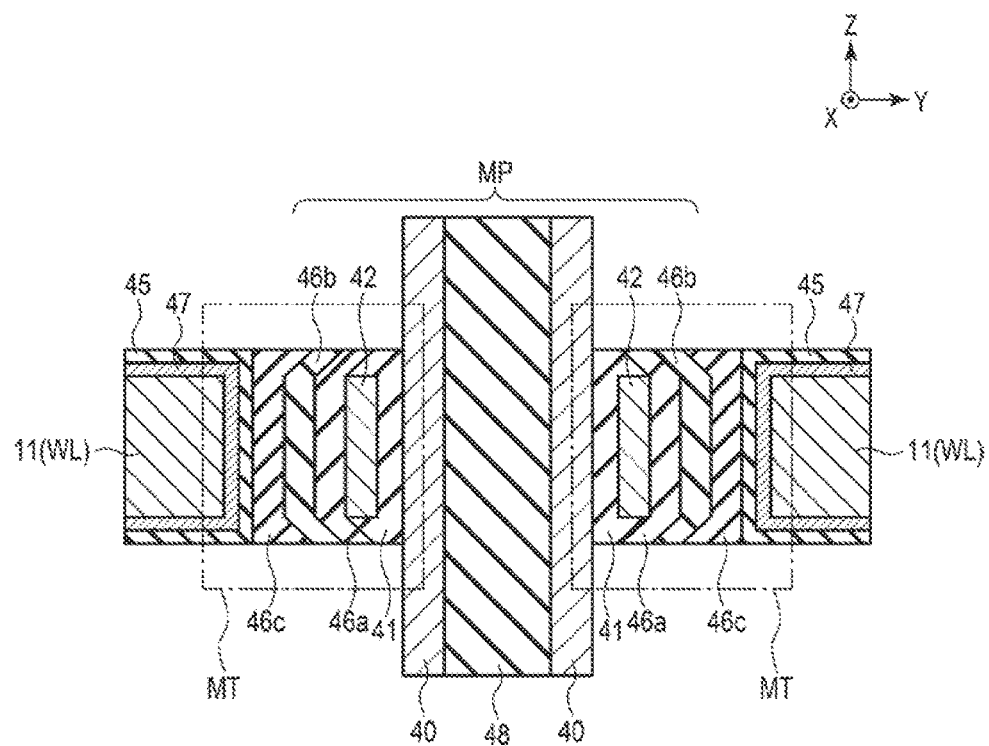
FIG. 10 is a cross-sectional view of the memory cell transistor according to the first embodiment.

Next, a second example will be described with reference to FIGS. 9 and 10. FIG. 9 is a cross-sectional view of the memory pillar MP in the XY plane. FIG. 10 is a cross-sectional view in the YZ plane and particularly illustrates an area in which two memory cell transistors MT are disposed. In the second example, a conductive film is used for the charge storage layer of the memory cell transistor MT.

As illustrated in the drawing, the memory pillar MP includes insulating layers 48 and 43 disposed in the Z direction, a semiconductor layer 40, an insulating layer 41, a conductive layer 42, and insulating layers 46a to 46c. The insulating layer 48, for example, is a silicon oxide film. The semiconductor layer 40 is disposed to surround the periphery of the insulating layer 48. The semiconductor layer 40, for example, is a polycrystalline silicon layer and functions as an area in which a channel of the memory cell transistor MT is formed, similar to the example illustrated in FIG. 7, is not separated between the memory cell transistors MT disposed inside the same memory pillar MP. The insulating layer 41 is disposed on the periphery of the conductive layer 40 and functions as a gate insulating layer of each memory cell transistor MT. In other words, the insulating layer 41 is divided into two areas in the XY plane illustrated in FIG. 9, and each area functions as a gate insulating film of two memory cell transistors MT disposed inside the same memory pillar MP. The insulating layer 41, for example, has a stacked structure of a silicon oxide film and a silicon nitride film. The conductive layer 42 is disposed on the periphery of the insulating layer 41 and is divided into two areas by the insulating layer 43 in the Y direction. The conductive layer 42, for example, is a polycrystalline silicon layer, and the divided two areas function as charge storage layers of the two memory cell transistors MT described above. On the periphery of the conductive layer 42, the insulating layers 46a, 46b, and 46c are sequentially disposed. The insulating layers 46a and 46c, for example, are silicon oxide films, and the insulating layer 46b, for example, is a silicon nitride film, and these function as block insulating films of the memory cell transistors MT. Such insulating layers 46a, 46b and 46c are divided into two areas in the Y direction, and an insulating layer 43 is disposed therebetween. In addition, inside the slit SLT2, the insulating layer 43 is embedded. The insulating layer 43, for example, is a silicon oxide film.

On the periphery of the memory pillar MP having the above-described configuration, for example, an AlO layer 45 is disposed. In addition, on the periphery of the AlO layer 45, for example, a barrier metal layer (a TiN film or the like) 47 is formed. On the periphery of the barrier metal layer 45, the conductive layer 11 functioning as a word line WL is disposed.

According to the configuration described above, inside one memory pillar MP, two memory cell transistors MT are disposed in the Y direction. The selection transistors ST1 and ST2 have similar configurations. In addition, between the memory cell transistors adjacent to each other in the Z direction, an insulating layer not illustrated in the drawing is disposed, and the charge storage layer 42 is insulated for each memory cell transistor by this insulating layer and the insulating layers 43 and 46.

Equivalent Circuit

Figure 11:
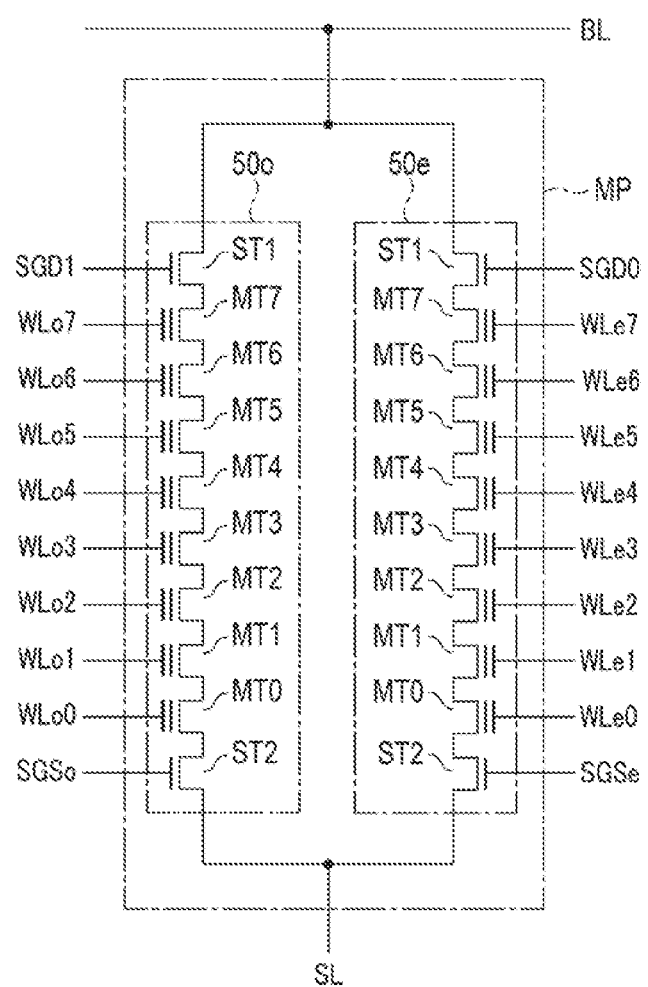
FIG. 11 is an equivalent circuit diagram of a memory pillar according to the first embodiment.

FIG. 11 is an equivalent circuit diagram of the memory pillar MP having the configuration described above. As illustrated in the drawing, two NAND strings 50o and 50e are formed in one memory pillar MP. In other words, selection transistors ST1 disposed in the same memory pillar MP are connected to different select gate lines SGD, and memory cell transistors MT are connected to different word lines WLo and WLe. In addition, selection transistors ST2 are connected to different select gate lines SGSo and SGSe. The two NAND strings 50o and 50e formed in the same memory pillar MP are connected to the same bit line BL and the same source line SL. However, current paths thereof are electrically separated.

1.2 Read Operation

Next, a data reading method for the NAND flash memory having the configuration described above will be described.

Figure 12:
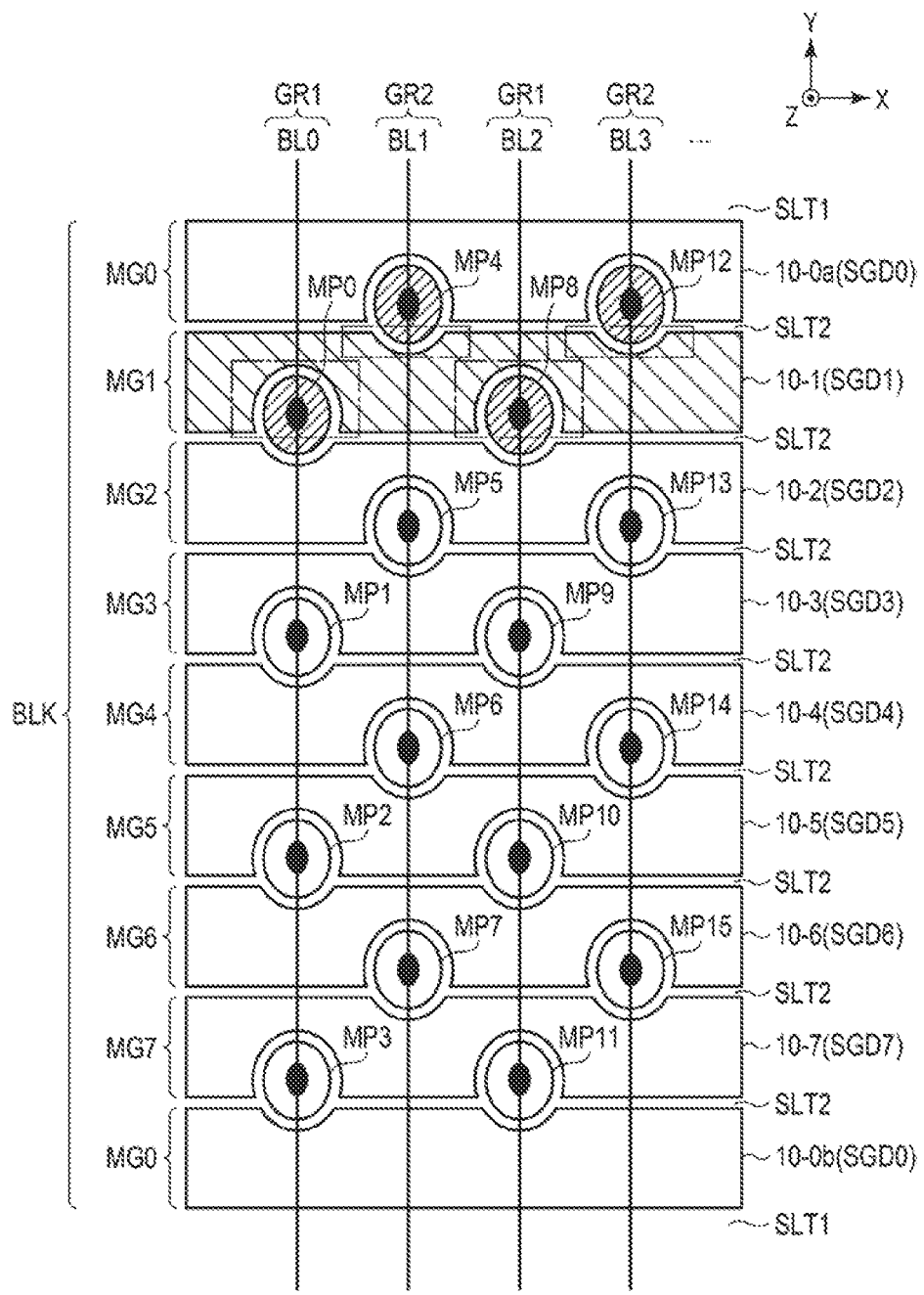
FIG. 12 is a planar layout of the select gate line according to the first embodiment.
Figure 13:
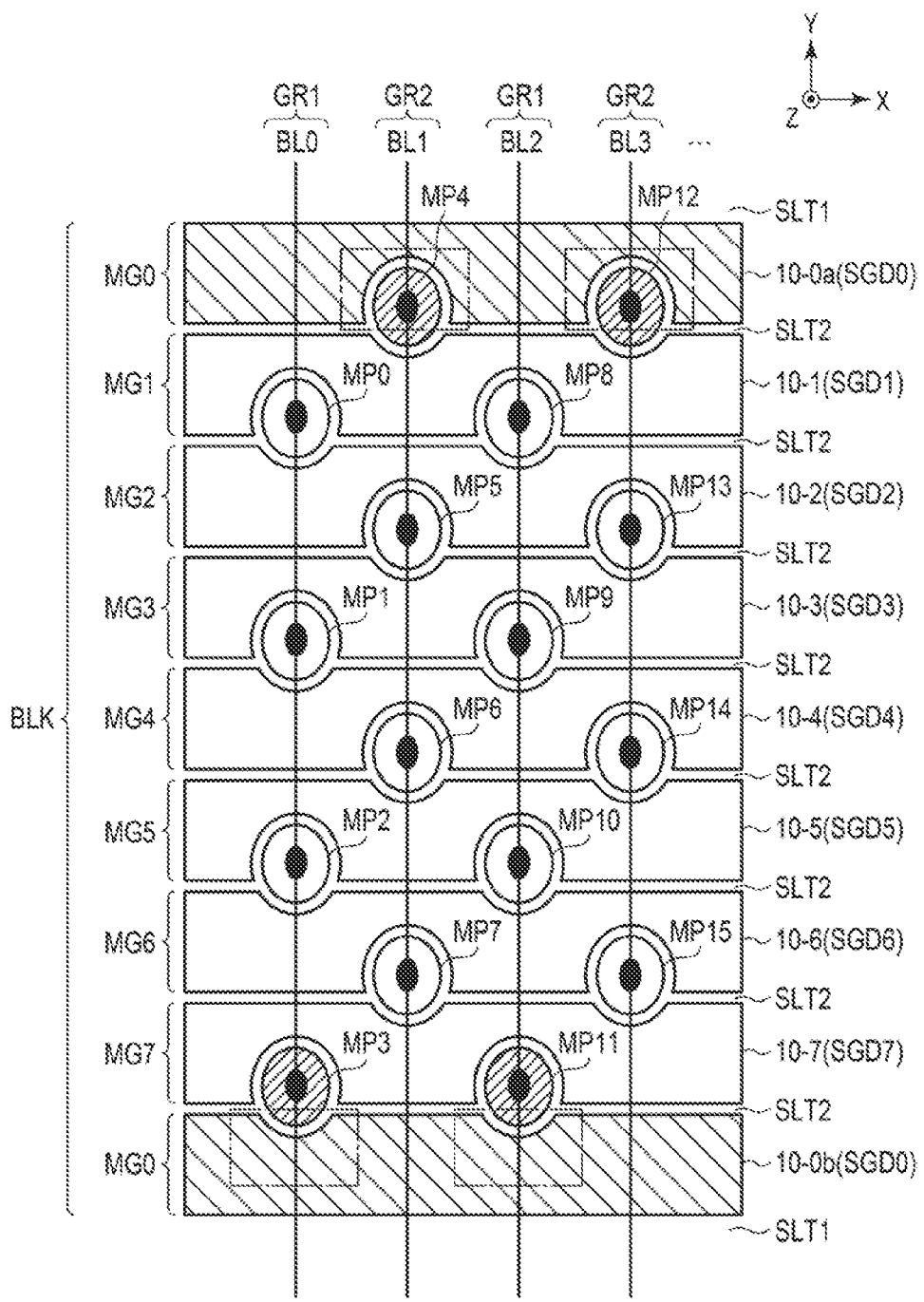
FIG. 13 is a planar layout of the select gate line according to the first embodiment.

First, the appearance in which a select gate line SGD is selected will be described with reference to FIGS. 12 and 13. FIGS. 12 and 13 are planar layout diagrams of the select gate line SGD in the XY plan corresponding to FIG. 3 described above, and diagonal lines are applied to a wiring layer 10 corresponding to a selected gate line SGD.

As illustrated in FIG. 12, when one of select gate lines SGD1 to SGD7 is to be selected, one of corresponding wiring layers 10-1 to 10-7 is selected. FIG. 12 illustrates a case where the select gate line SGD1 is selected. As the wiring layer 10-1 is selected, four memory cell transistors MT disposed in the memory pillars MP0, MP4, MP8, and MP12 are selected. In other words, one page is formed by four memory cell transistors MT belonging to a wiring layer 11-1 corresponding to one of the word lines WL disposed below the wiring layer 10-1. This similarly applies also to a case where one of the select gate lines SGD2 to SGD7 is selected.

In contrast to this, both wiring layers 10-0a and 10-0b positioned at both ends within the block BLK are simultaneously selected. This corresponds to a case where the select gate line SGD0 is selected. This appearance is illustrated in FIG. 13.

As illustrated in the drawing, when the select gate line SGD0 is to be selected, two memory cell transistors MT that are positioned right below the wiring layer 10-0a and are disposed in the memory pillars MP4 and MP12 and two memory cell transistors MT that are positioned right below the wiring layer 10-0b and are disposed in the memory pillars MP3 and MP11 are selected. In other words, one page is formed by such four memory cell transistors MT.

Figure 14:
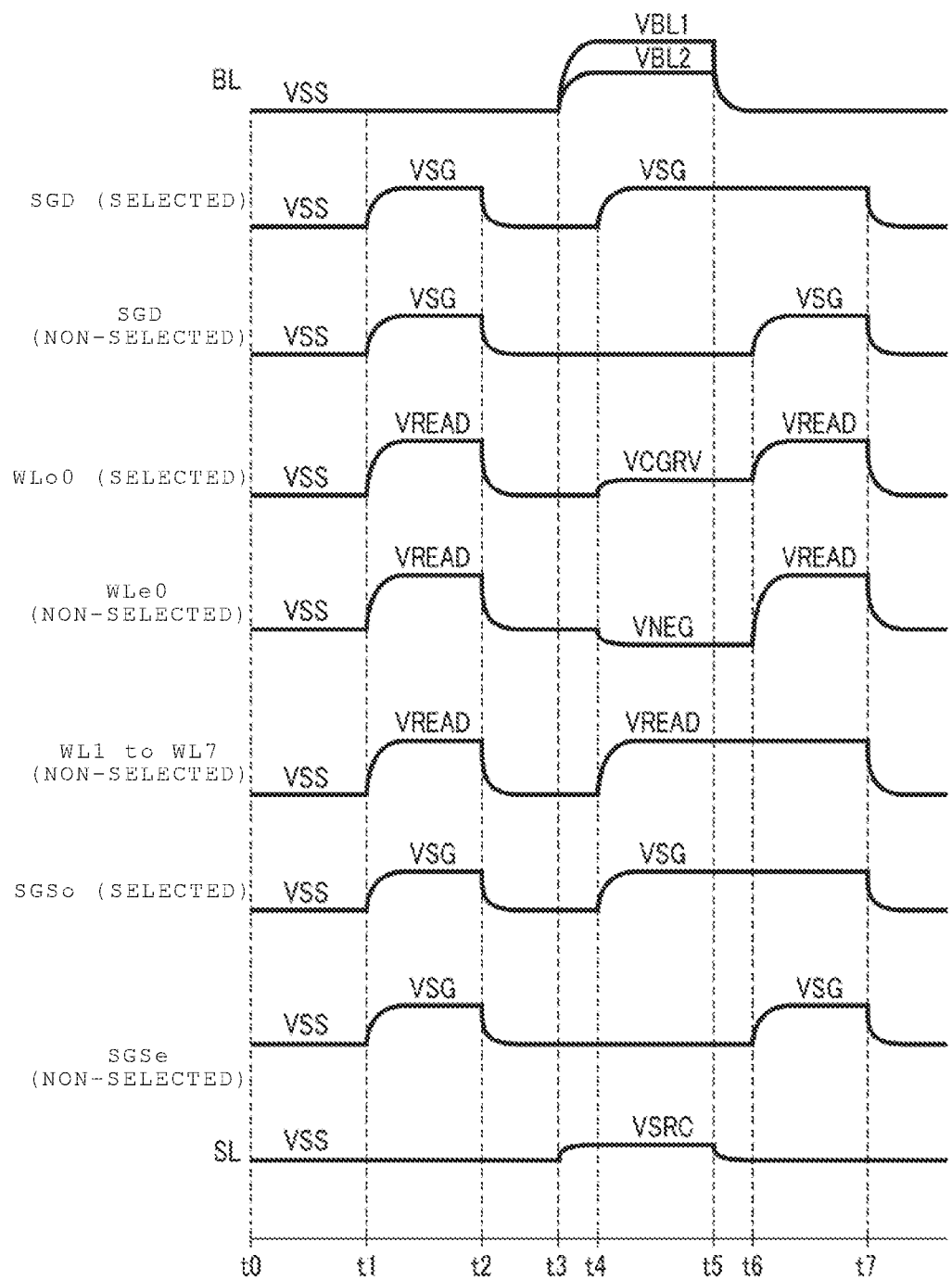
FIG. 14 is a timing chart of various signals at the time of a read operation according to the first embodiment.

FIG. 14 is a timing diagram that illustrates voltage changes in various wirings when an odd-numbered select gate line SGDo (in other words, an odd-numbered memory group MG) and a word line WLo0 are selected.

As illustrated in the drawing, first, at time t1, a voltage VSG is applied to all the select gate lines SGD in the selected block BLK, and the selection transistor ST1 enters an On-state. In addition, a voltage VREAD is applied to all the word lines, and the memory cell transistor MT enters the On-state regardless of the stored data. Furthermore, a voltage VSG is applied to all the select gate lines SGS, and the selection transistor ST2 enters the On-state. Accordingly, all the NAND strings 50 of the selected block BLK are in the conductive state, and a voltage VSS (for example, 0 V) is transmitted to the channel.

Next, at time t3, the sense amplifier 4 pre-charges the bit line BL. At this time, even-numbered bit lines BL0 and BL2 belonging to the group GR1 are pre-charged to a voltage VBL2, and odd-numbered bit lines BL1 and BL3 belonging to the group GR2 are pre-charged to a voltage VBL1 that is higher than the voltage VBL2.

Then, at time t4, a voltage VSG is applied to the selected select gate lines SGD and SGSo, a read voltage VCGRV is applied to the selected word line WLo0, a voltage VNEG is applied to the non-selected word line WLe0, and a voltage VREAD is applied to the other non-selected word lines WL1 to WL7. The voltage VCGRV is a voltage corresponding to a read level and is a voltage used for determining whether stored data of the selected memory cell transistor MT is "0" or "1". The voltage VNEG, for example, is a negative voltage or 0 V and is a voltage used for turning off the memory cell transistor MT.

As a result, when the selected memory cell transistor MT is turned on, a current flows from the bit line BL to the source SL. On the other hand, when the selected memory cell transistor MT is turned off, no current flows. Accordingly, the stored data of the selected memory cell transistor MT is determined.

1.3 Effect According to this Embodiment

According to this embodiment, variations in the memory cell characteristics between the memory groups MG are corrected, and the operational reliability of the semiconductor memory device can be improved. This effect will be described below.

In the semiconductor memory device according to this embodiment, as described with reference to FIGS. 3 and 4, one memory pillar MP is disposed to straddle two select gate lines SGD aligned in the XY plane and two word lines WL. Then, two memory cell transistors MT are disposed inside this memory pillar MP and are controlled using the two select gate lines SGD and the word lines WL.

In this configuration, there are cases where a deviation occurs in a positional relation between the memory pillar MP and corresponding two word lines WL (and the select gate lines SGD). More specifically, in FIGS. 3 and 4, for any one memory pillar MP, it is preferable that a center portion of the memory pillar MP in the Y direction is positioned exactly between the corresponding two word lines. The reason for this is that, by arranging the memory pillars MP as such, the sizes of the two memory cell transistors MT controlled by the corresponding two word lines WL are the same.

However, in a case where the position of the memory pillar MP deviates, the sizes of the corresponding two memory cell transistors MT are different from each other. For example, in the examples illustrated in FIGS. 3 and 4, the memory pillar MP is shown to deviate to the wiring layer 10-0a side in the Y direction. As a result, for the wiring layers 10-1 and 11-1 and the memory pillars MP0 and MP4, the memory pillar MP0 overlaps the wiring layers 10-1 and 11-1 by a distance d1, and the memory pillar MP4 overlaps the wiring layers 10-1 and 11-1 by a distance d2, and a relation of d1>d2 is formed. A similar relation is formed between the memory pillars MP8 and MP12.

In other words, for the memory group MG1, the memory cell transistor MT connected to an even-numbered bit line BLe has a large cell size, and the memory cell transistor MT connected to an odd-numbered bit line BLo has a small cell size. A large/small cell size may be rephrased by a large/small current driving capability of the memory cell transistor MT.

In other words, as is apparent from FIG. 3, in a case where an even-numbered select gate line SGDe is selected, memory cell transistors MT connected to the bit lines BL0 and BL2, in other words, the memory cell transistors MT belonging to the group GR1 have small sizes. On the other hand, memory cell transistors MT connected to the bit lines BL and BL3, in other words, the memory cell transistors MT belonging to the group GR2 have large sizes.

To the contrary, in a case where an odd-numbered select gate line SGDo is selected, memory cell transistors MT connected to the bit lines BL0 and BL2, in other words, the memory cell transistors MT belonging to the group GR1 have large sizes. On the other hand, memory cell transistors MT connected to the bit lines BL1 and BL3, in other words, the memory cell transistors MT belonging to the group GR2 have small sizes.

In this way, in a case where the position of the memory pillar MP deviates, the memory cell transistors MT having different sizes are alternately arranged on the same page. Thus, in this embodiment, according to the size of the selected memory cell transistor MT, the pre-charge electric potential at the time of a read operation is controlled by the sense amplifier 4.

More specifically, when an even-numbered select gate line SGDe, in other words, an even-numbered memory group MGe is to be selected, the sense amplifier 4 applies high pre-charge potential VBL1 to the bit lines BL of the group GR1 and applies low pre-charge potential VBL2 to the bit lines BL of the group GR2. On the other hand, when an odd-numbered select gate line SGDo, in other words, an odd-numbered memory group MGo is to be selected, the sense amplifier 4 applies low pre-charge potential VBL2 to the bit lines BL of the group GR1 and applies high pre-charge potential VBL1 to the bit lines BL of the group GR2.

As a result, a difference in the current driving force according to the cell size of the memory cell transistor MT is offset by the pre-charge potential, and a difference in the cell current flowing through the bit line BL at the time of a read operation between bit lines can be decreased. In other words, a condition for the flow of a sufficiently large cell current is applied to a memory cell transistor MT through which it is difficult for the cell current to flow, and a condition for preventing the cell current is applied to a memory cell transistor MT through which it is easy for the cell current to flow. Accordingly, particularly, the occurrence of erroneous read from the memory cell transistor MT through which it is difficult for the cell current to flow is prevented, and the operational reliability of the semiconductor memory device can be improved.

In the configuration according to this embodiment, as illustrated in FIG. 3, the wiring layers 10-0a and 10-0b positioned at both end portions of the block BLK are simultaneously selected and function as the select gate line SGD0. The reason for this is that, while four memory pillars MP (memory cell transistors MT) are formed in each of the other wiring layers 10-1 to 10-7, only two memory pillars MP (memory cell transistors MT) are formed in each of the wiring layers 10-0a and 10-0b. Thus, for both the end portions of the block BLK, the two wiring layers 10-0a and 10-0b are caused to function electrically as one select gate line SGD. Accordingly, also when the select gate line SGD0 is selected, the size of one page is the same as that of a case where any one of the other select gate lines SGD1 to SGD7 is selected.

As a result of the alignment of page sizes as described above, as illustrated in FIG. 3, the number of wiring layers 10 functioning as select gate lines SGD within one block BLK is an odd number in the XY plane. As illustrated in FIG. 4, this similarly applies also to the wiring layer 11 functioning as word lines WL. In other words, when seen in the XY plane, the number of wiring layers positioned between the slits SLT1 is an odd number.

Figure 15:
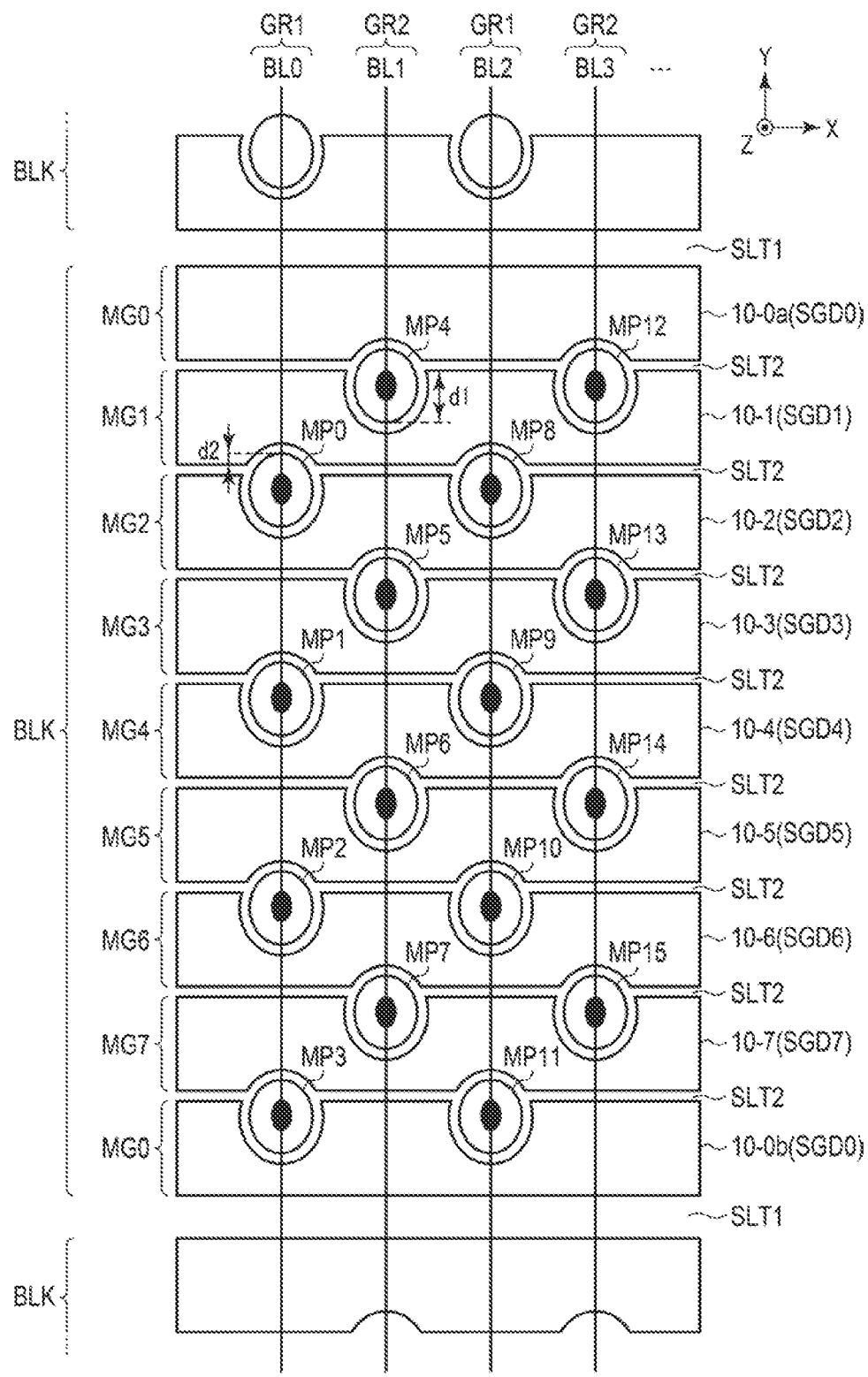
FIG. 15 is a planar layout of a select gate line according to a first modified example of the first embodiment.

The side of the deviation of the memory pillars MP may be opposite to that of the case illustrated in FIGS. 3 and 4. The appearance of such a case is illustrated in FIG. 15. FIG. 15 illustrates a planar layout of select gate lines SGD according to a modified example of this embodiment. As illustrated in the drawing, in this example, the positions of memory pillars MP deviate to the wiring layer 10-0b side in the Y direction, which is opposite to that of the case illustrated in FIG. 3. As a result, for the wiring layers 10-1 and 11-1 and the memory pillars MP0 and MP4, the memory pillar MP0 overlaps the wiring layers 10-1 and 11-1 by a distance d2, and the memory pillar MP4 overlaps the wiring layers 10-1 and 11-1 by a distance d1 (>d2). In this case, voltages applied to the bit lines BL at the time of reading data are opposite to those of the case of the embodiment described above.

In other words, when an even-numbered select gate line SGDe, in other words, an even-numbered memory group MGe is to be selected, the sense amplifier 4 applies low pre-charge potential VBL2 to the bit lines BL of the group GR1 and applies high pre-charge potential VBL1 to the bit lines BL of the group GR2. On the other hand, when an odd-numbered select gate line SGDo, in other words, an odd-numbered memory group MGo is to be selected, the sense amplifier 4 applies high pre-charge potential VBL1 to the bit lines BL of the group GR1 and applies low pre-charge potential VBL2 to the bit lines BL of the group GR2.

2. Second Embodiment

Next, a semiconductor memory device according to a second embodiment will be described. This embodiment relates to a write operation according to the first embodiment. Hereinafter, only points different from those of the first embodiment will be described.

2.1 First Example

First, a first example will be described. A data writing operation includes a program operation changing a threshold by injecting electrons into a charge storage layer and a program verification operation checking whether or not the threshold arrives at a defined value as a result of the program operation. According to the first example, in the program operation, voltages applied to bit lines BL are configured to be different between groups GR1 and GR2.

Figure 16:
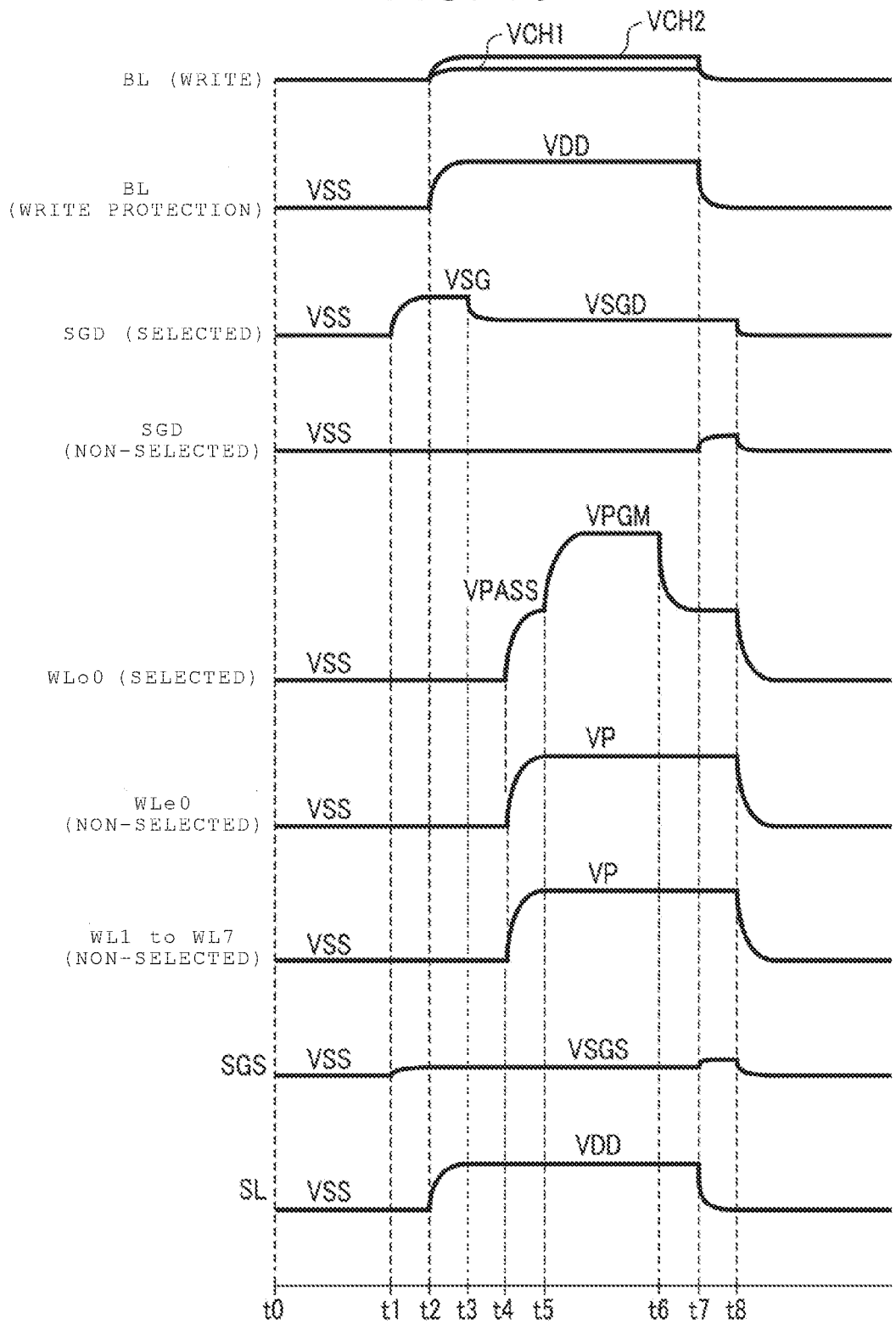
FIG. 16 is a timing chart of various signals at the time of a write operation according to a second embodiment.

FIG. 16 is a timing diagram that illustrates voltage changes in various wirings when an odd-numbered select gate line SGDo (in other words, an odd-numbered memory group MG) and a word line WLo0 are selected at the time of writing data.

As illustrated in FIGS. 12 and 13, in a case where an odd-numbered select gate line SGDo is selected, the memory cell transistors MT belonging to the group GR1 (BL0 and BL2) have large sizes, and the memory cell transistors MT belonging to the group GR2 (BL1 and BL3) have small sizes. As an overlapping area between the word lines WL and the memory pillars MP increases, the coupling rate increases, and the writing speed of the memory cell transistor MT increases. In other words, the group GR1 has a high writing speed is high, the group GR2 has a low writing speed.

Accordingly, at time t2, the sense amplifier 4 applies a relatively high voltage VCH2 to the bit lines BL0 and BL2 belonging to the group GR1 and applies a low voltage VCH1 to the bit lines BL1 and BL3 belonging to the group GR2. Here, VCH2>VCH1.

Subsequently, the row decoder 3 applies a voltage VPASS to all the word lines WL0 to WL7 at time t4 and raises the voltage of the selected word line WLo0 from VPASS to VPGM at time t5. The voltage VPASS is a voltage that can be used for turning on the memory cell transistor MT regardless of stored data and sufficiently raising the channel electric potential of a non-selected NAND string 50 through coupling. In addition, the voltage VPGM is a high voltage used for injecting electrons into the charge storage layer through FN tunneling. Here VPGM>VPASS.

According to this method, by configuring a bit line voltage corresponding to a memory cell transistor MT having a high writing speed to be high, the wiring speed can be lowered. Accordingly, a difference in the writing speed between the groups GR1 and GR2 can be decreased.

2.2 Second Example

Next, a second example will be described. According to the second example, at the time of a program operation, the value of the voltage VPGM applied to the selected word line WL is changed between the groups GR1 and GR2.

Figure 17:
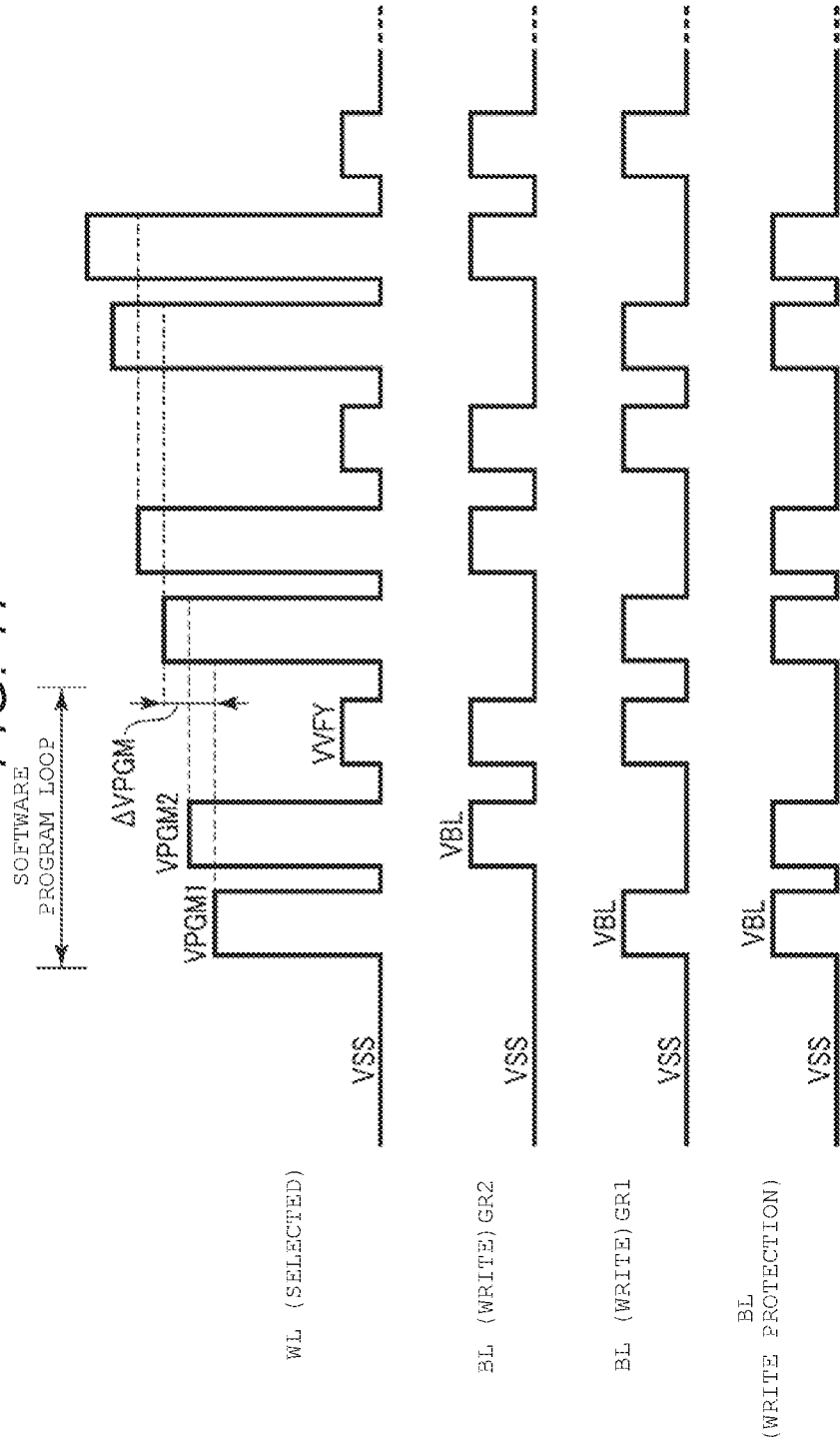
FIG. 17 is a timing chart of various signals at the time of the write operation according to the second embodiment.

FIG. 17 is a timing diagram that illustrates a change in the electric potential of a selected word line WL and bit lines BL according to this example and illustrates a case where an even-numbered memory group MG, in other words, an even-numbered select gate line SGDe is selected.

As described above, a write operation includes a program operation and a program verification operation. This combination is called a software program loop. In a write operation, by repeating the software program loop a plurality number of times, data corresponding to one page is written.

In this example, at the time of a program operation, two kinds of program voltages VPGM1 and VPGM2 are applied to a selected word line WL, and there is a relation of VPGM2>VPGM1. In a case where an even-numbered memory group MG is selected, the writing speeds of the memory cell transistors MT belonging to the group GR1 (BL0 and BL2) are low, and the writing speeds of the memory cell transistors MT belonging to the group GR2 (BL1 and BL3) are high. Accordingly, the voltage VPGM1 is used as a program voltage for the group GR2, and the voltage VPGM2 is used as a program voltage for the group GR1.

More specifically, during a period in which the voltage VPGM1 is applied, a write-protect voltage VBL is applied to the bit lines BL0 and BL2 of the group GR1, and a write voltage (for example, 0 V, which is lower than the voltage VBL) is applied to the bit lines BL1 and BL3 of the group GR2. As a result, data is programmed in the memory cell transistors MT connected to the bit lines BL1 and BL3.

On the other hand, during a period in which the voltage VPGM2 is applied, the write-protect voltage VBL is applied to the bit lines BL1 and BL3 of the group GR2, and the write voltage is applied to the bit lines BL0 and BL2 of the group GR1. As a result, data is programmed in the memory cell transistors MT connected to the bit lines BL0 and BL2.

According to this method, a high program voltage is used for the memory cell transistors MT having low writing speeds, and a low program voltage is used for the memory cell transistors having high writing speeds. In this way, a difference in the writing speed between the groups GR1 and GR2 can be decreased. In addition, a step-up width ΔVPGM of the program voltage VPGM may be changed in the groups GR1 and GR2. It is apparent that the step-up width ΔVPGM is large in the group having a low writing speed.

2.3 Third Example

Next, a third example will be described. In the third example, at the time of a program verification operation, by configuring pre-charge potential for the group having a low writing speed to be low, a cell current is relatively decreased. In other words, a method of applying voltages to the bit lines BL is similar to that illustrated in FIG. 14 described in the first embodiment.

According to this method, in a memory cell transistor having a low writing speed, as the software program loop is repeated a plurality of number of times, the threshold of the cell increases, and it is difficult for the cell current flows, whereby it becomes easy to pass the program verification. As a result, a difference in the writing speed between the groups GR1 and GR2 can be decreased.

2.4 Effects Relating to this Embodiment

According to this embodiment, also in a case where a writing speed is different between memory cell transistors belonging to the same page, the numbers of software program loops for these to pass the program verification can be configured to be a same level. Accordingly, the number of times of performing the software program loop can be decreased, and a purchasing speed can be improved. In addition, it can prevent a situation where a memory cell transistor having a high writing speed quickly passes the program verification and thereafter, is disturbed by a write operation for a memory cell transistor having a low writing speed for a long time. Accordingly, the reliability of the write operation can be improved.

3. Third Embodiment

Next, a semiconductor memory device according to a third embodiment will be described. This embodiment relates to a planar layout that is different from those of the first and second embodiments, and, for example, two bit lines are disposed above one memory pillar. Hereinafter, only points different from the first and second embodiments will be described.

3.1 Planar Layout

Figure 18:
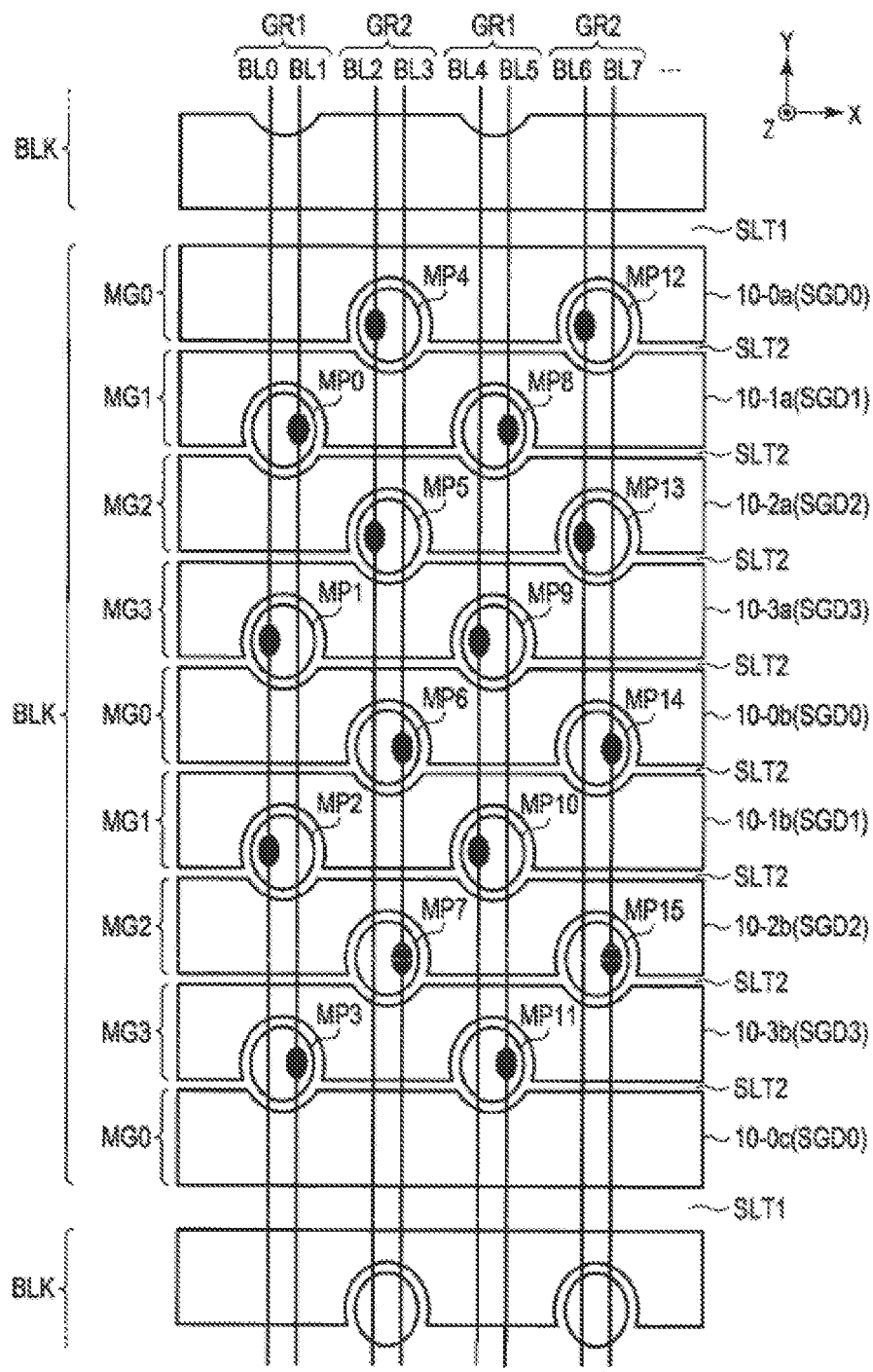
FIG. 18 is a planar layout of a select gate line according to a third embodiment.
Figure 19:
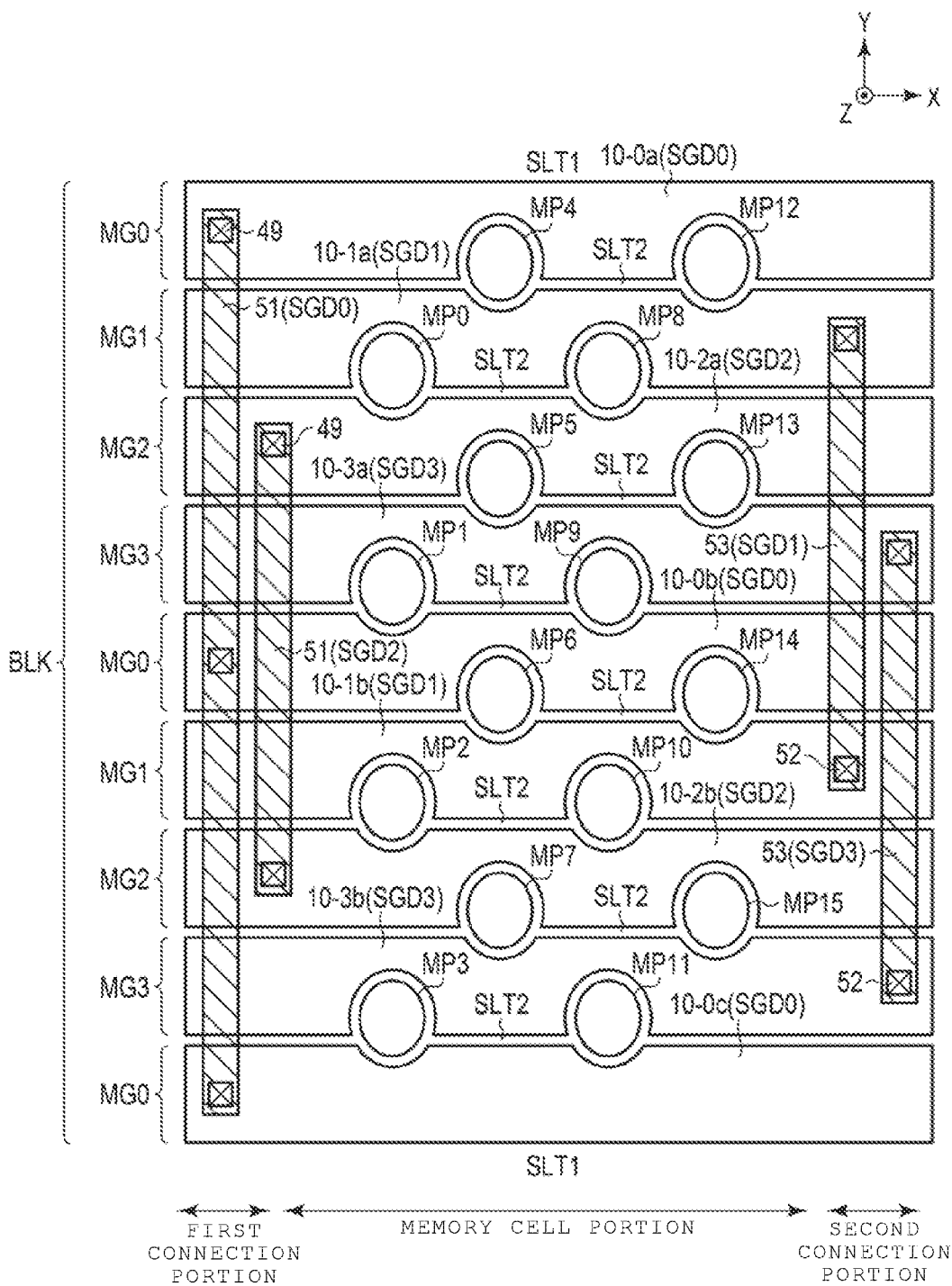
FIG. 19 is a planar layout of the select gate line according to the third embodiment.

FIGS. 18 and 19 illustrate planar layouts of select gate lines SGD of a certain block BLK in the XY plane. FIG. 18 also illustrates the appearance of bit lines BL in the same manner as FIG. 3 in the first embodiment. In FIG. 19, the illustration of a memory cell portion is simplified, and, particularly, the configurations of a first connection portion and a second connection portion are focused. In this example, a case where four select gate lines SGD are provided in one block BLK will be described.

As illustrated in the drawing, nine conductive layers 10 extending in the X direction are provided. In this example, the wiring layers 10-1 to 10-7 and 10-0b described in FIG. 3 are respectively relabeled as wiring layers 10-1a, 10-2a, 10-3a, 10-0b, 10-1b, 10-2b, 10-3b, and 10-0c. A slit SLT2 is disposed between the wiring layers 10, which is similar to the first embodiment.

Within a block BLK, two wiring layers 10-0a and 10-0c positioned at both ends in the Y direction and a wiring layer 10-0b positioned at the center function as a select gate line SGD0. These three wiring layers 10-0, as illustrated in FIG. 19, for example, in the first connection portion, are commonly connected by using a contact plug 49 and a metal wiring layer 51, and are further connected to a row decoder 3. In addition, the wiring layers 10-1a and 10-1b are commonly connected in the second connection portion by using a contact plug 52 and a metal wiring layer 53, and are further connected to the row decoder 3. Furthermore, the wiring layers 10-2a and 10-2b are commonly connected in the second connection portion by using the contact plug 49 and the metal wiring layer 51, and are further connected to the row decoder 3. In addition, the wiring layers 10-3a and 10-3b are commonly connected in the first connection portion by using the contact plug 52 and the metal wiring layer 53, and are further connected to the row decoder 3.

As illustrated in FIG. 18, two bit lines BL pass above one memory pillar MP. However, only one of these two bit lines BL is connected to the memory pillar MP.

In other words, above the memory pillars MP0 to MP3, two bit lines BL0 and BL1 are disposed. The bit line BL0 is commonly connected to the memory pillars MP1 and MP2, and the bit line BL1 is commonly connected to the memory pillars MP0 and MP3. In addition, above the memory pillars MP4 to MP7, two bit lines BL2 and BL3 are disposed. The bit line BL2 is commonly connected to the memory pillars MP4 and MP5, and the bit line BL3 is commonly connected to the memory pillars MP6 and MP7. Furthermore, above the memory pillars MP8 to MP11, two bit lines BL4 and BL5 are disposed. The bit line BL4 is commonly connected to the memory pillars MP9 and MP10, and the bit line BL5 is commonly connected to the memory pillars MP8 and MP11. In addition, above the memory pillars MP12 to MP15, two bit lines BL6 and BL7 are disposed. The bit line BL6 is commonly connected to the memory pillars MP12 and MP13, and the bit line BL7 is commonly connected to the memory pillars MP14 and MP15. Accordingly, in the case of this example, the bit lines BL0, BL1, BL4, and BL5 and the memory pillars MP0 to MP3 and MP8 to MP11 belong to a group GR1, and the bit lines BL2, BL3, BL6, and BL7, and the memory pillars MP4 to MP7 and MP12 to MP15 belong to a group GR2.

The other configurations are as described in the first embodiment.

3.2 Page Selecting Method

Next, a method of selecting page at the time of reading data and at the time of writing data will be described.

Figure 20:
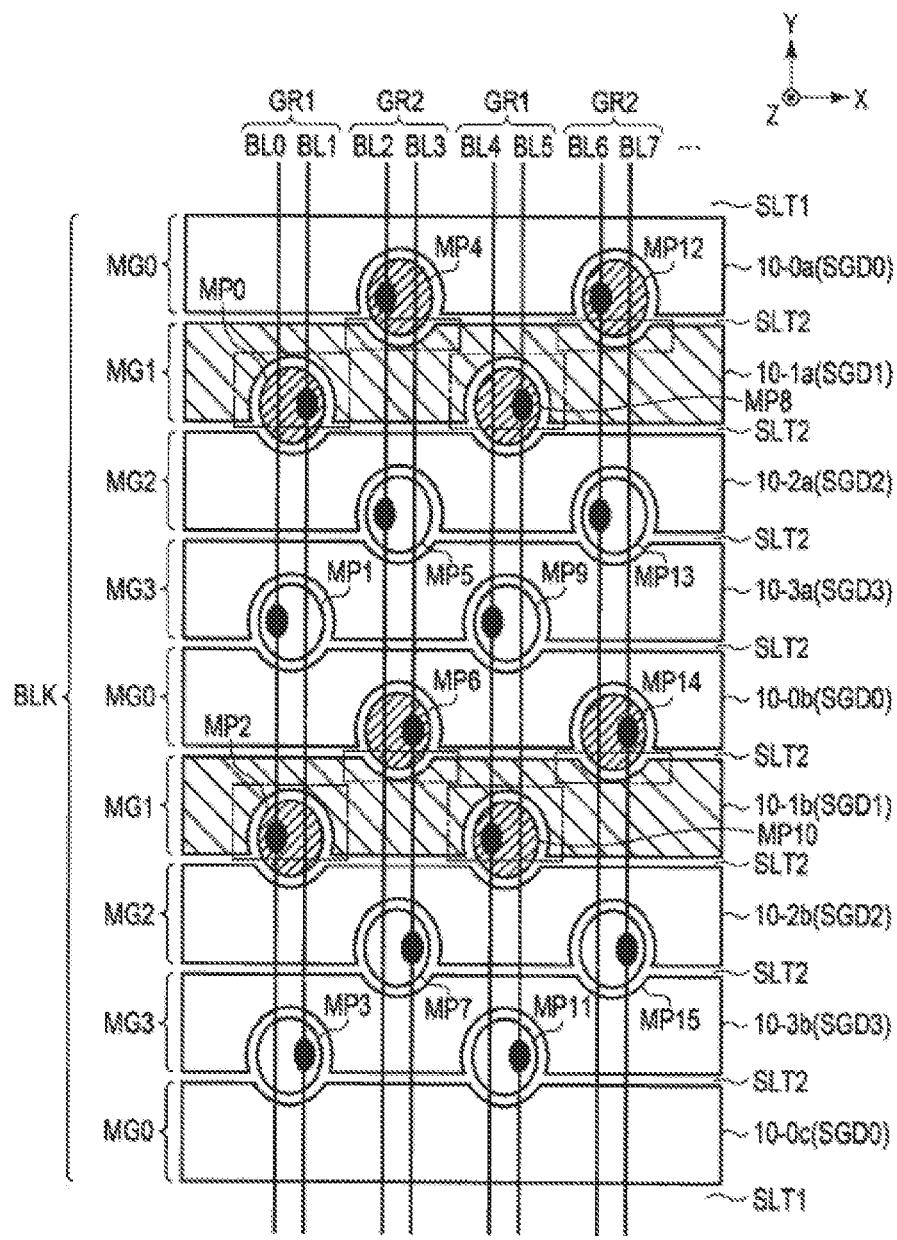
FIG. 20 is a planar layout of the select gate line according to the third embodiment.
Figure 21:
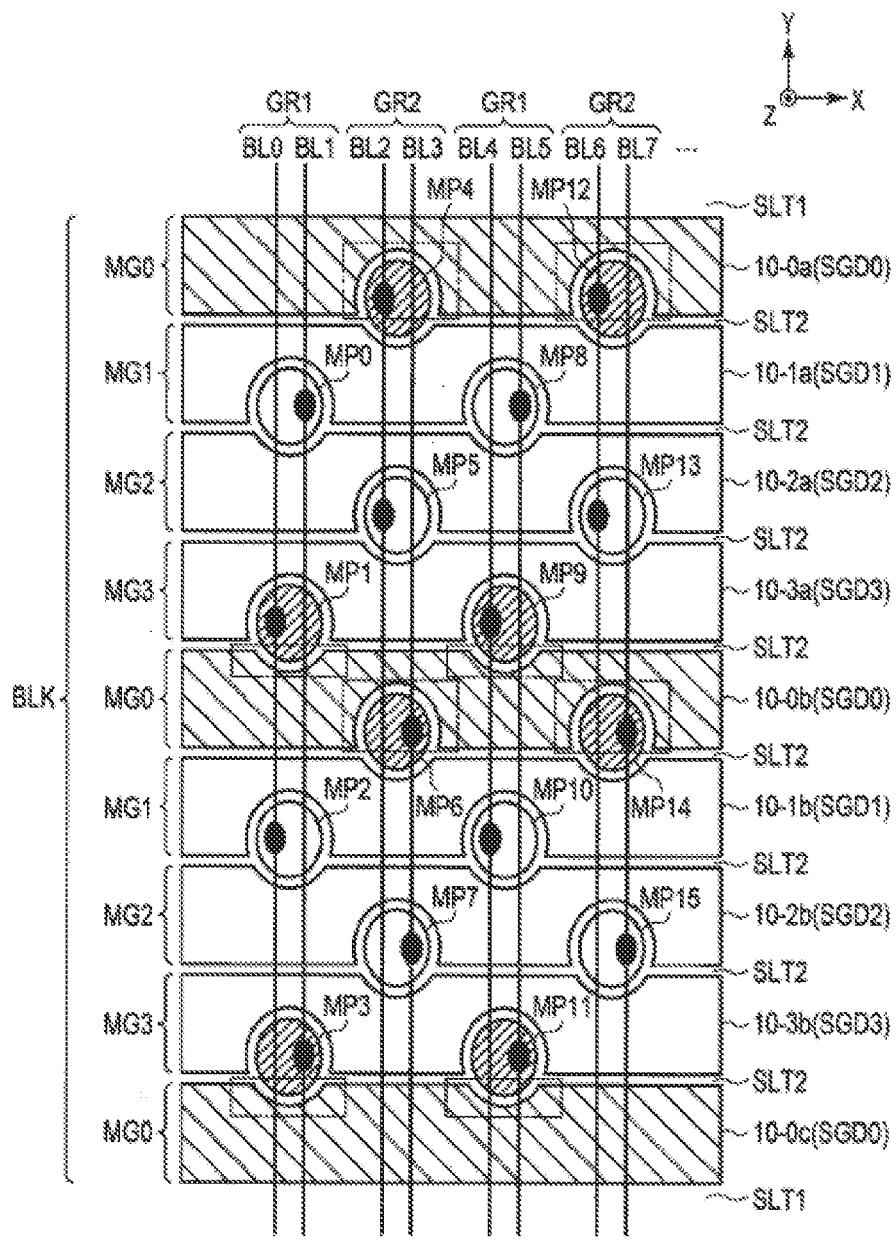
FIG. 21 is a planar layout of the select gate line according to the third embodiment.

In this example, two or three wiring layers 10 are commonly connected. Accordingly, the plurality of wiring layers 10 that are commonly connected are simultaneously selected. FIGS. 20 and 21 are planar layout diagrams of select gate lines SGD in the XY plane that correspond to FIG. 18 described above, and diagonal lines are applied to wiring layers 10 corresponding to a selected gate line SGD.

As illustrated in FIG. 20, when one of select gate lines SGD1 to SGD3 is selected, corresponding two wiring layers 10 are selected. In FIG. 20, a case is illustrated in which the select gate line SGD1 is selected. In this case, as the two wiring layers 10-1a and 10-1b are selected, eight memory cell transistors MT disposed in the memory pillars MP0, MP4, MP8, and MP12 and the memory pillars MP2, MP6, MP10, and MP14 are selected. In other words, one page is formed by eight memory cell transistors MT belonging to the wiring layers 11-1a and 11-1b corresponding to one of the word lines WL disposed right below the wiring layers 10-1a and 10-1b. This similarly applies also to a case where the select gate lines SGD2 and SGD3 are selected.

In contrast to this, in a case where the select gate line SGD0 is selected, as illustrated in FIG. 21, three wiring layers 10 including a wiring layer 10-0b positioned at the center of the block BLK in addition to wiring layers 10-0a and 10-0c positioned at both ends within the block BLK are simultaneously selected. Accordingly, two memory cell transistors MT that are disposed in the memory pillars MP4 and MP12 positioned right below the wiring layer 10-0a, two memory cell transistors MT that are disposed in the memory pillars MP3 and MP11 positioned right below the wiring layer 10-0c and, and four memory cell transistors MT that are disposed in the memory pillars MP1, MP6, MP9, and MP14 positioned right below the wiring layer 10-0b are selected. In other words, one page is formed by such eight memory cell transistors MT.

The method of reading data and the method of writing data are described in the first and second embodiment.

3.3 Effect Relating to this Embodiment

According to this embodiment, by causing two or more wiring layers 10 to function as one select gate line SGD, the size of one page can be increased. In addition, in the method of connecting the select gate lines SGD according to this example, when a plurality of wiring layers 10 are selected, the effects of interferences between cells received by memory cell transistors MT associated with each wiring layer (including the effects of capacitance and resistance) can be almost the same between the wiring layers.

For example, in FIG. 19, in a case where the select gate line SGD2 is selected, the wiring layers 10-2a and 10-2b are charged. The wiring layers 10 adjacent to the wiring layer 10-2a in the Y direction are the wiring layers 10-1a functioning as the select gate line SGD1 and 10-3a functioning as the wiring layer SGD3. The wiring layers 10 adjacent to the wiring layer 10-2b in the Y direction are the wiring layers 10-1b and 10-3b functioning as the select gate lines SGD1 and SGD3. In this way, while one select gate line SGD is divided into two wirings in the memory cell portion, a combination of select gate lines adjacent to each other in the Y direction is common to these divided two wirings. In other words, the influences received by the divided two wirings from the wirings adjacent to each other are almost the same. This is similar also to a case where any one of the select gate lines SGD is selected. Accordingly, characteristic variations between the select gate lines SGD are prevented, and the operational reliability can be improved.

Figure 22:
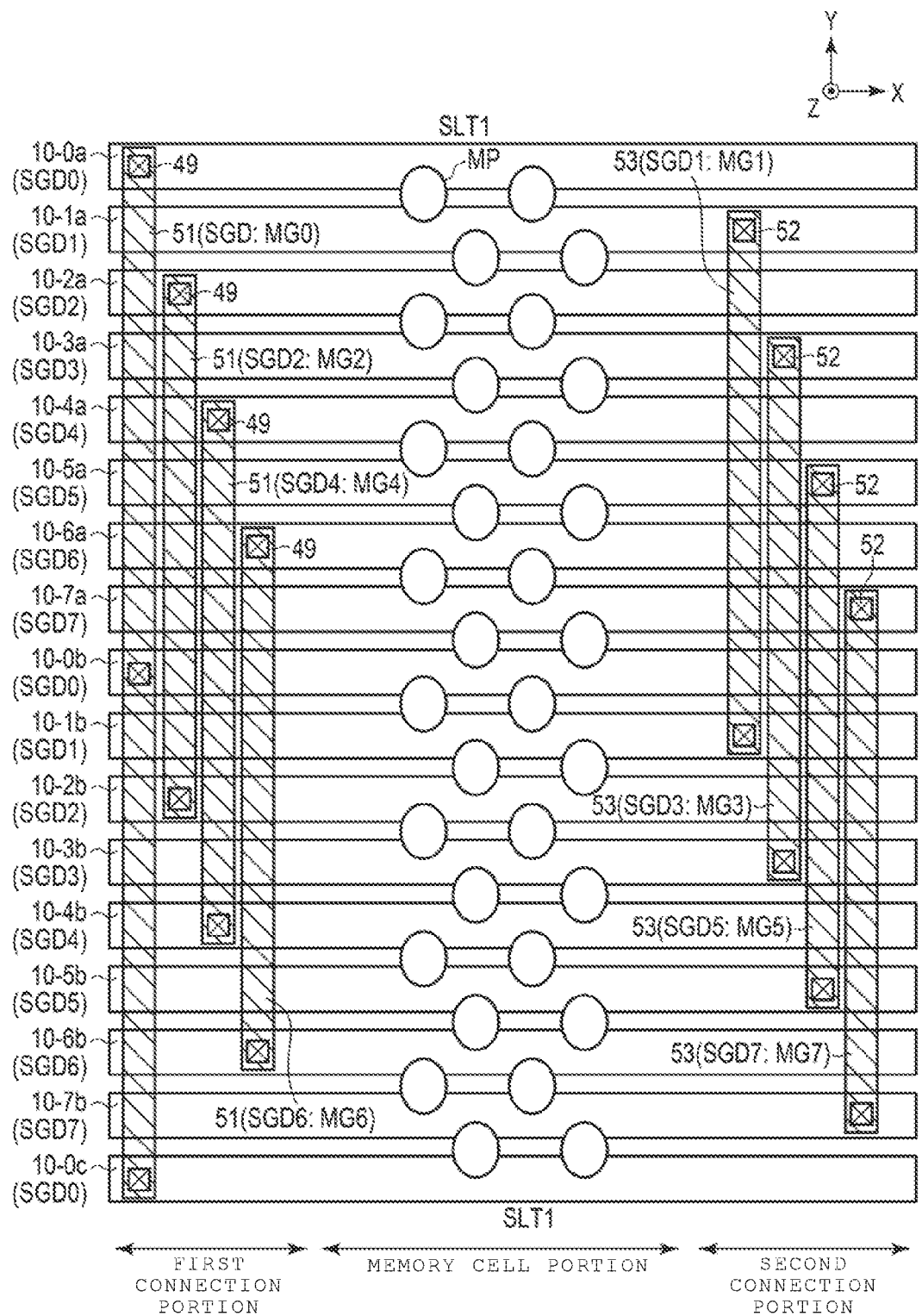
FIG. 22 is a planar layout of a select gate line according to a first modified example of the third embodiment.

FIG. 22 is a plan view of select gate lines SGD according to a modified example of this embodiment in the XY plane. As illustrated in the drawing, this example illustrates an example of a case where the number of wirings 10 within one block BLK is 17. As illustrated in the drawing, for example, wiring layers 10-0a, 10-1a, 10-2a, 10-3a, 10-4a, 10-5a, 10-6a, 10-7a, 10-0b, 10-1b, 10-2b, 10-3b, 10-4b, 10-5b, 10-6b, 10-7b, and 10-0c are sequentially arranged in the Y direction. The wiring layers 10-0a and 10-0c positioned at both ends and the wiring layer 10-b positioned at the center function as a select gate line SGD0. In addition, the wiring layers 10-1a and 10-1b function as a select gate line SGD1, the wiring layers 10-2a and 10-2b function as a select gate line SGD2, and so on. In this way, the number of the wiring layers 10 can be appropriately increased.

Figure 23:
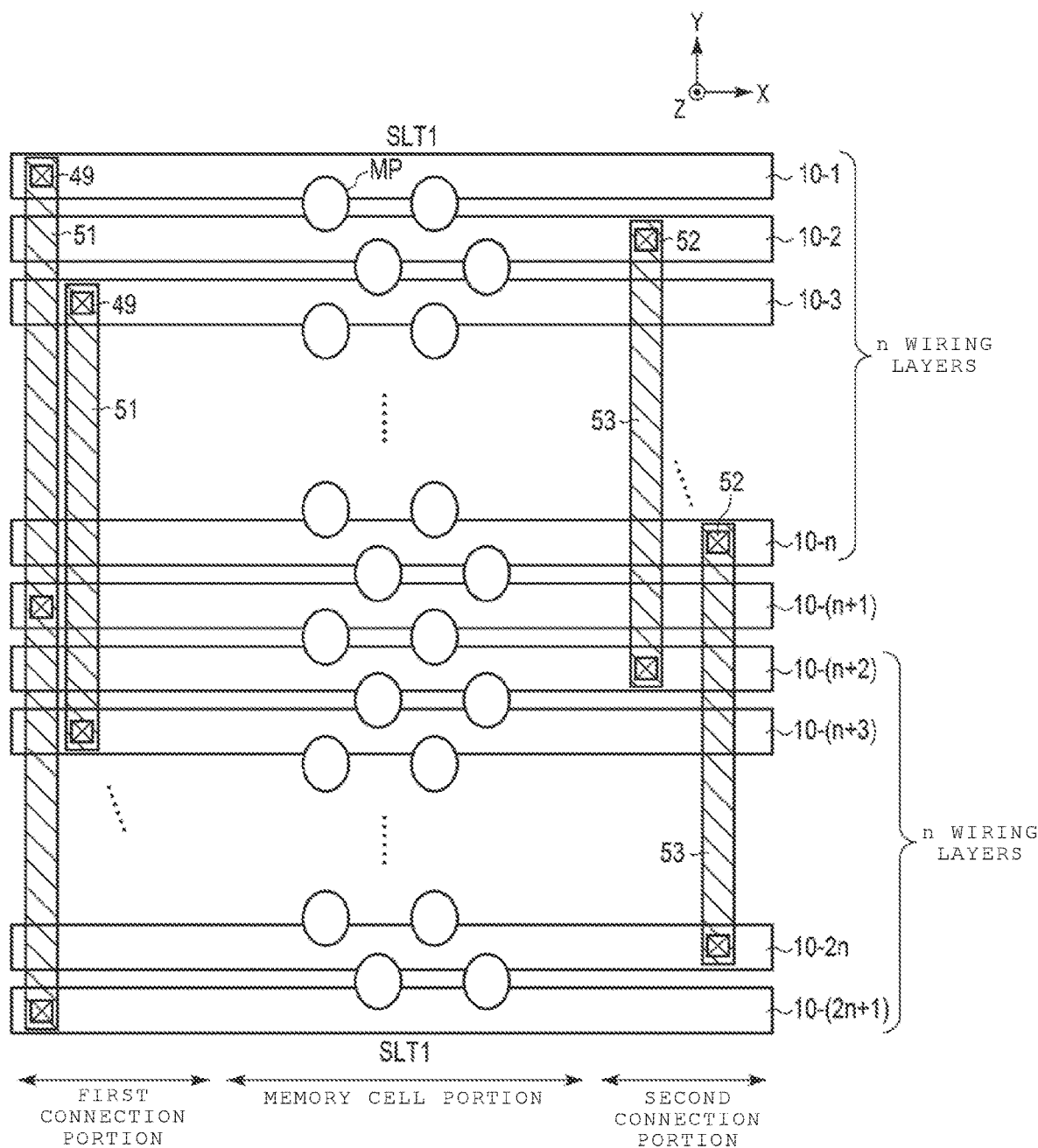
FIG. 23 is a planar layout of a select gate line according to a second modified example of the third embodiment.

The different configurations can be generally represented as in FIG. 23. FIG. 23 is a planar layout of select gate lines SGD. As illustrated in the drawing, (2n+1) wiring layers 10-1 to 10-(2n+1) are arranged in the Y direction. Here, n is a natural number of two or more. The first wiring layer 10-1, the wiring layer 10-(n+1) positioned at the center, and the last wiring layer 10-(2n+1) are commonly connected. Among the remaining wiring layers 10, the i-th wiring layer and the (i+n)-th wiring layer are commonly connected. Here, i is a natural number of 2 to n.

4. Fourth Embodiment

Next, a semiconductor memory device according to a fourth embodiment will be described. This embodiment relates to an example different from the third embodiment in the method of connecting the wiring layers 10 functioning as the select gate line SGD. Hereinafter, only points different from the first to third embodiments will be described.

4.1 Planar Layout

Figure 24:
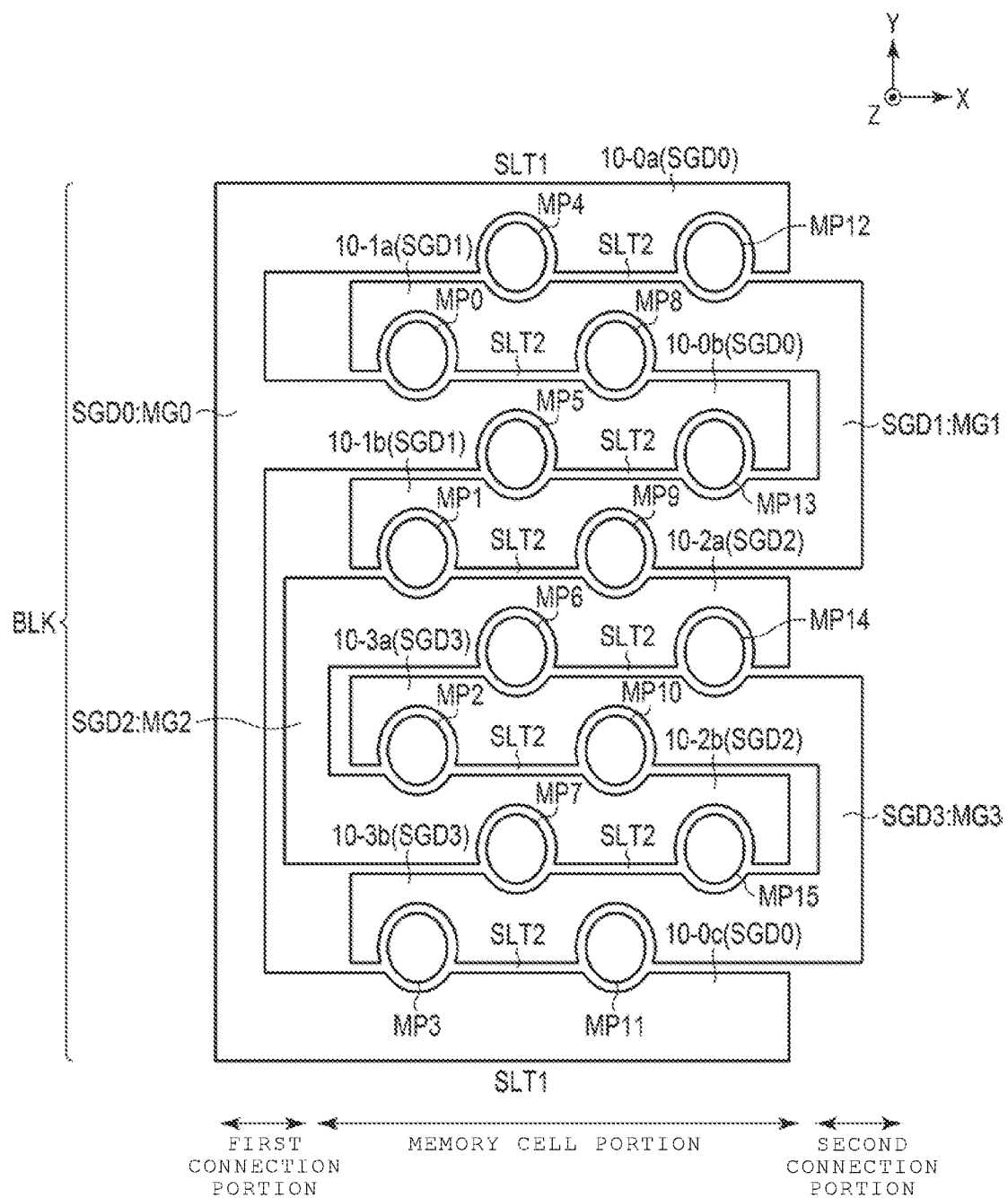
FIG. 24 is a planar layout of a select gate line according to a fourth embodiment.

FIG. 24 is a planar layout of select gate lines SGD in a certain block BLK on the XY plane and corresponds to FIG. 19 described in the third embodiment. While the bit lines BL are not illustrated, the bit lines BL are similar to those according to the third embodiment.

As illustrated in the drawing, in the layout according to this example, two wiring layers 10-0a and 10-0c disposed at both ends with one wiring layer 10 and one wiring layer 10-0b interposed therebetween in the Y direction are drawn out up to a first connection portion and are commonly connected. These three wring layers 10-0a, 10-0b, and 10-0c function as a select gate line SGD0. Among the remaining wiring layers 10, two wiring layers adjacent to each other with one wiring layer 10 interposed therebetween in the Y direction are commonly connected in a connection portion. In other words, as illustrated in FIG. 24, the wiring layers 10-1a and 10-1b are drawn out up to a second connection portion to be commonly connected and function as a select gate line SGD1. In addition, the wiring layers 10-2a and 10-2b are drawn out up to the first connection portion to be commonly connected and function as a select gate line SGD2. Furthermore, the wiring layers 10-3a and 10-3b are drawn out up to the second connection portion to be commonly connected and function as a select gate line SGD3.

At the time of reading data and at the time of writing data, two or three wiring layers 10 that are commonly connected in the first connection portion or the second connection portion are simultaneously driven.

4.2 Effect According to this Embodiment

As above, as the method of connecting select gate lines SGD described in the third embodiment, a method according to this embodiment may be used. According to this embodiment, since there is no intersection between the plurality of wiring layers 10, the plurality of wiring layers 10 can be commonly connected in the layer of the wiring layers 10. In other words, similar to the case illustrated in FIG. 19, an additional layer does not need to be used by using the contact plug and the metal wiring layer. Therefore, the manufacturing method can be simplified.

Figure 25:
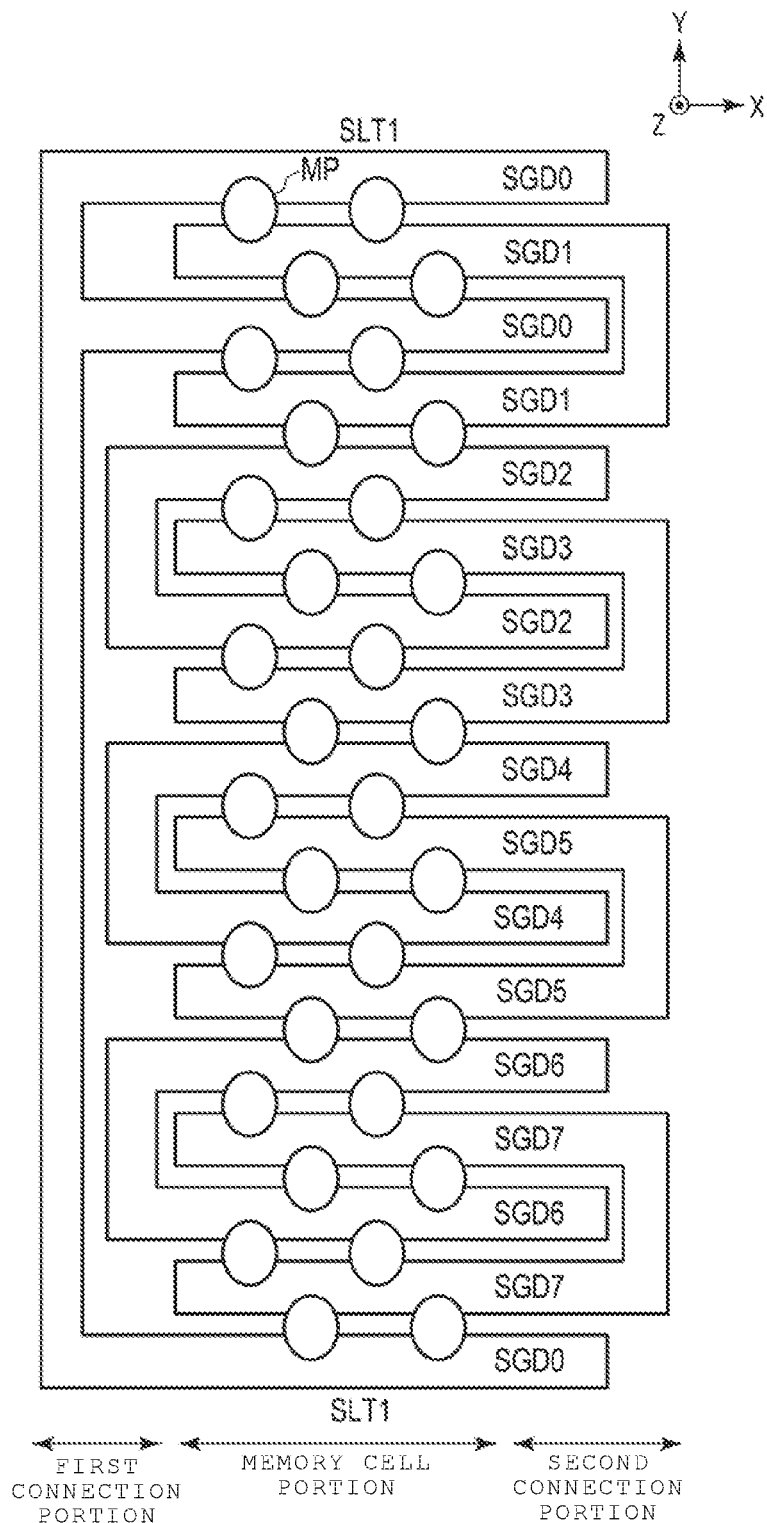
FIG. 25 is a planar layout of a select gate line according to a first modified example of the fourth embodiment.

FIG. 25 is a planar layout of select gate lines SGD according to a modified example of this embodiment and, similar to FIG. 22, illustrates an example of a case where the number of wiring layers 10 within one block BLK is 17. As illustrated in the drawing, two wiring layers 10 disposed at both ends in the Y direction and a third wiring layer 10, are drawn out up to the first connection portion and function as a select gate line SGD0. The other wiring layers, similar to those illustrated in FIG. 24, two wiring layers 10 that are adjacent to each other in the Y direction with a certain wiring layer 10 interposed therebetween are commonly connected in the first connection portion or the second connection portion.

Figure 26:
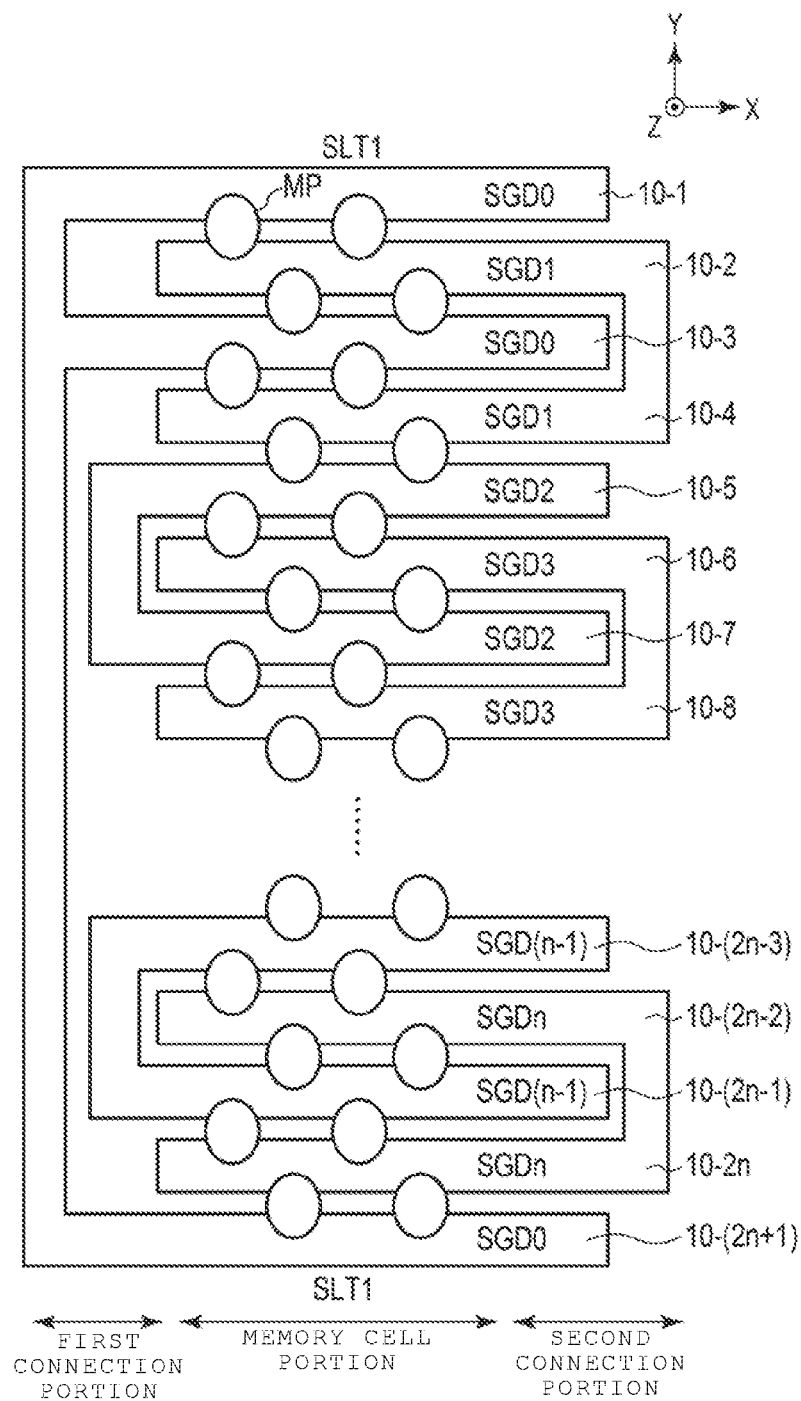
FIG. 26 is a planar layout of a select gate line according to a second modified example of the fourth embodiment.

FIG. 26 illustrates an appearance in which (2n+1) writing layers 10-1 to 10-(2n+1) are arranged in the Y direction. Here, n is a natural number of two or more. The first wiring layer 10-1, the third wiring layer 10-3, and the last wiring layer 10-(2n+1) are commonly connected. Among the remaining wiring layers 10 and the (k+2)-th wiring layers are commonly connected. Here, k is 2, 5, 6, 7, 10, . . . , 10-(2n−3), and 10-(2n−2).

5. Modified Examples

As above, the semiconductor memory device according to the embodiment includes: a first region (denoted by BLK in FIG. 3) that is disposed above the semiconductor substrate and includes a plurality of first wirings (denoted by SGD in FIG. 3) arranged in parallel with each other in a first direction (X direction in FIG. 3) that is an in-plane direction of the semiconductor substrate, first insulating films (denoted by SLT2 in FIG. 3) separating the first wirings (denoted by SGD in FIG. 3) adjacent to each other and first pillars (denoted by MP in FIG. 3) disposed to straddle the first wirings (denoted by SGD in FIG. 3) that are adjacent to each other; and second and third regions (denoted by SLT1 in FIG. 3) that are positioned to have the first region (BLK) interposed therebetween in a second direction (the Y direction illustrated in FIG. 3) which is different from the first direction and which is an in-plane direction of the semiconductor substrate and include second insulating films disposed from the semiconductor substrate to the height of the first wirings (denoted by SGD in FIG. 3). The first pillar (MP) includes a conductive layer, a gate insulating film, and a charge storage layer (FIGS. 7 to 10). The number of first wirings (SGD) disposed within the first region (denoted by BLK in FIG. 3) is an odd number (FIG. 3).

According to this configuration, the operation of the semiconductor memory device can be improved. The embodiments described above are merely examples, and various modifications thereof can be made.

For example, in the embodiments described above, while a case where the number of bit lines BL passing above the memory pillar MP is one or two is described as an example, the number of bit lines may be three, four, or more. In addition, the number of select gate lines SGD is not limited to 9 or 17. Furthermore, the configuration in which two NAND strings are disposed inside the memory pillar MP is not limited to the structure described in the first embodiment described above. Such a structure is, for example, described in U.S. patent application Publication Ser. No. 14/819,706 filed on Aug. 6, 2015, entitled "SEMICONDUCTOR MEMORY DEVICE and METHOD FOR MANUFACTURING THE SAME," and the entire contents of such patent application are incorporated herein by reference.

Figure 27:
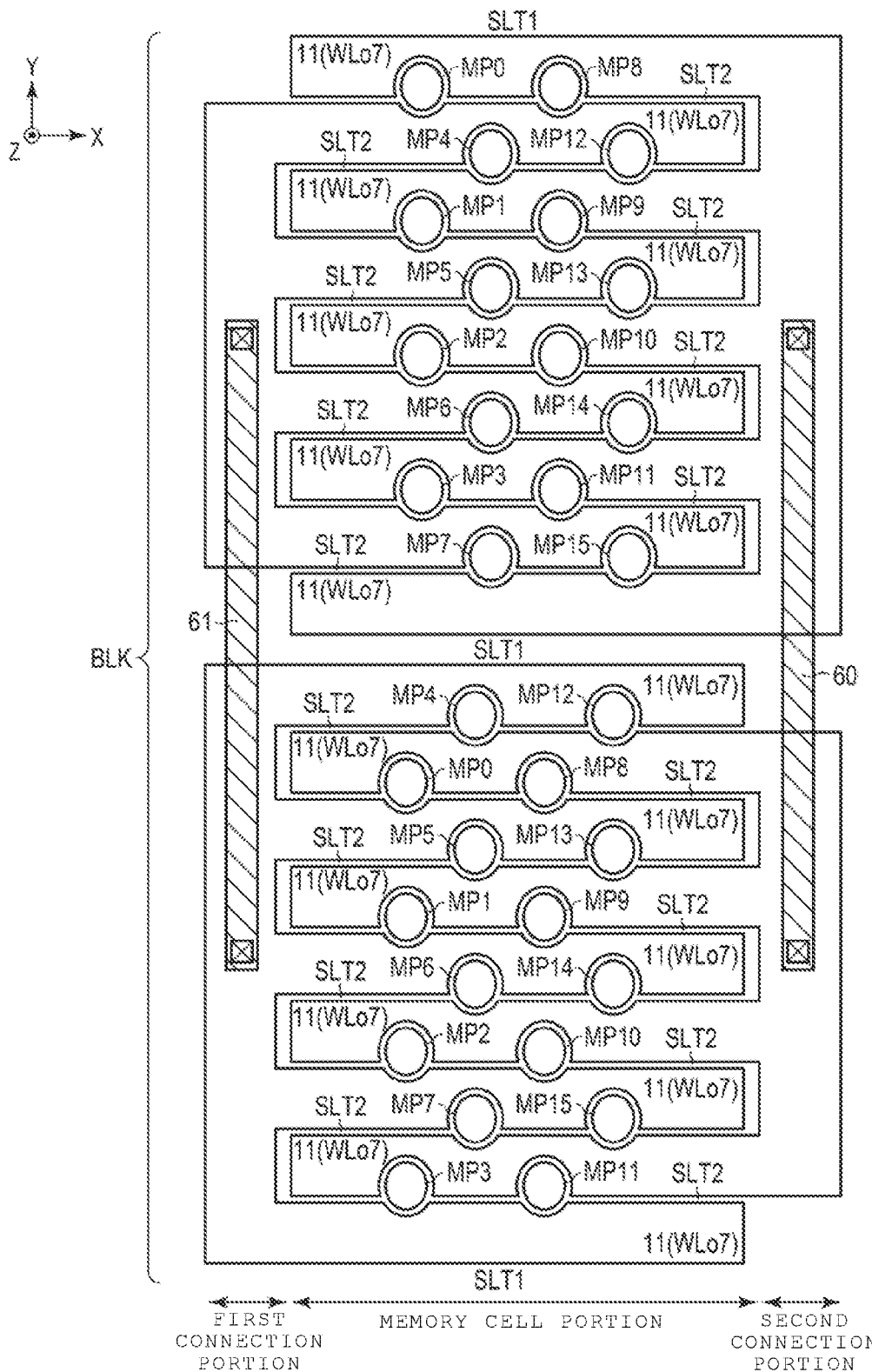
FIG. 27 is a planar layout of a word line according to first modified examples of the first to fourth embodiments.

In addition, in the embodiments described above, the planar layout of the word lines WL is described with reference to FIG. 4. However, the number of word lines WL provided in one block BLK can be appropriately selected, and the method of connecting the word lines WL can be appropriately selected. In addition, for example, as illustrated in FIG. 27, a configuration in which the configuration illustrated in FIG. 4 is arranged in two stages in the Y direction may be employed. In this configuration, the slit SLT1 is disposed not only at both ends of one block BLK in the Y direction but at the center of the block BLK. In the example illustrated in FIG. 27, on one side having the slits SLT1 interposed therebetween, four word lines WL are commonly connected in the first connection portion, and the remaining three word lines WL are commonly connected in the second connection portion. On the other hand, on the other side having the slits SLT1 interposed therebetween, four word lines WL are connected in the second connection portion, and the remaining three word lines WL are connected in the first connection portion. Two sets of word line WL group having the slit SLT1 interposed therebetween are connected using the wiring layers 60 and 61. In this configuration, the number (nine in the case illustrated in FIG. 27) of word lines WL driven from the first connection portion side and the number of word lines WL driven from the second connection portion side can be configured to be the same.

Figure 28:
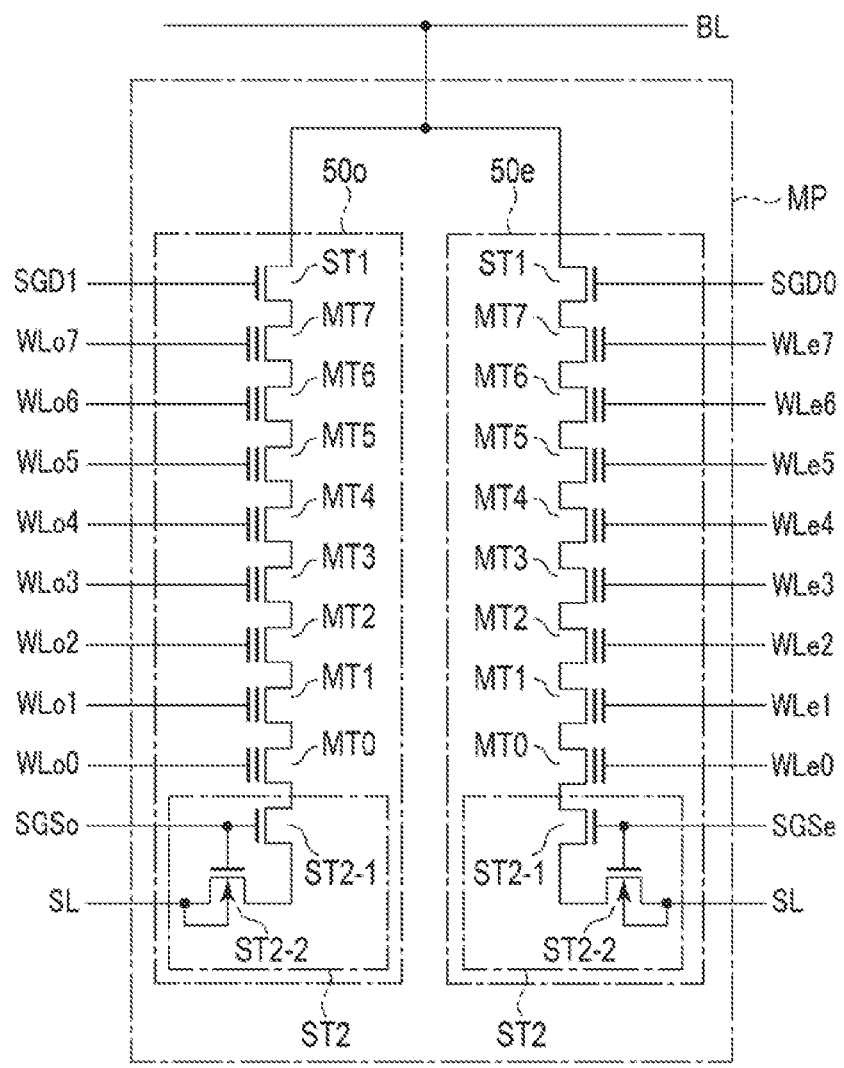
FIG. 28 is an equivalent circuit diagram of a memory pillar according to second modified examples of the first to fourth embodiments.
Figure 29:
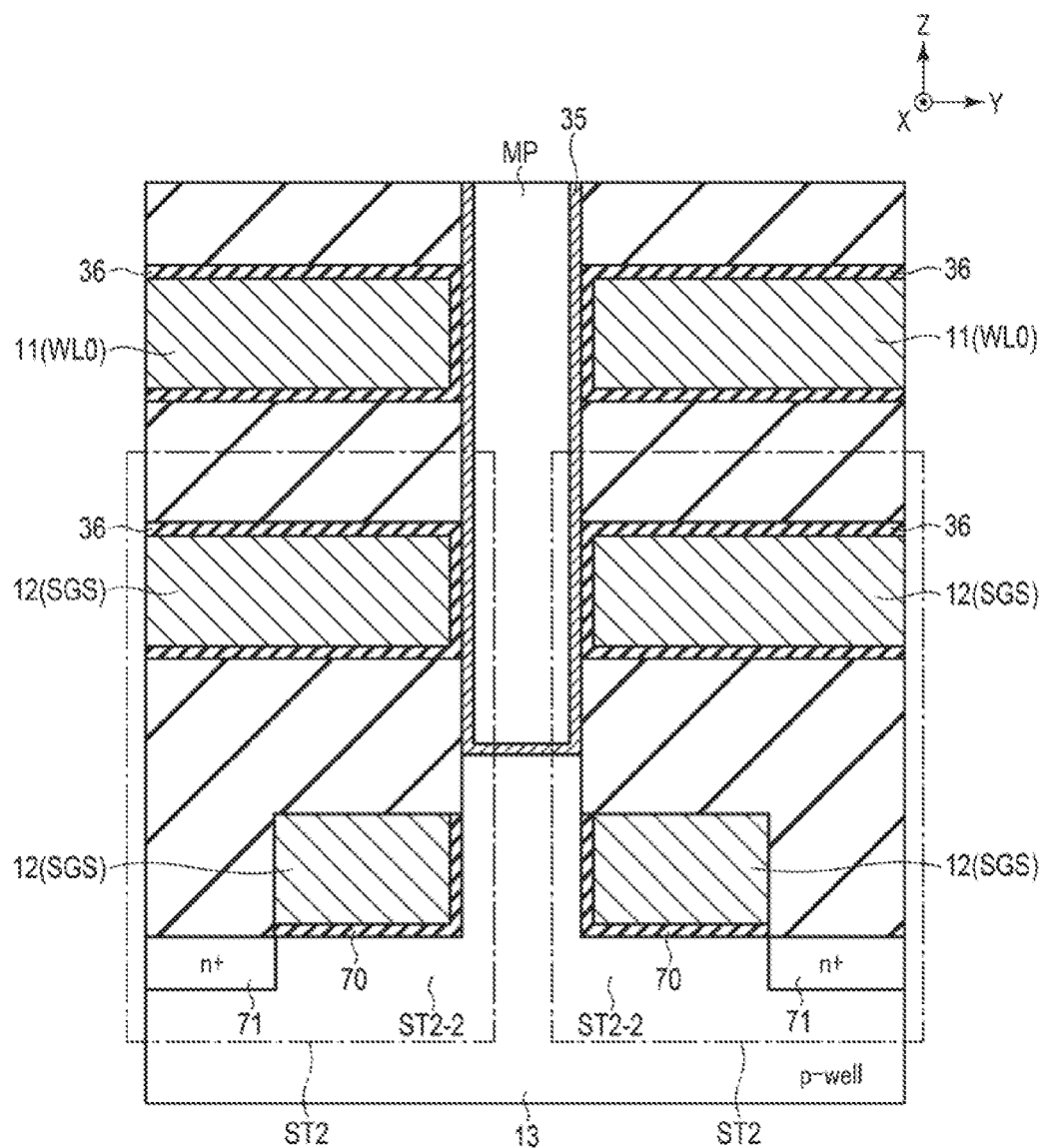
FIG. 29 is a cross-sectional view of a partial area of a memory pillar according to third modified examples of the first to fourth embodiments.

In addition, the selection transistor ST2, for example, may include two transistor structures. FIG. 28 is an equivalent circuit diagram corresponding to one memory pillar MP. As illustrated in the drawing, the selection transistor ST2 may include two transistors ST2-1 and ST2-2 that are commonly connected. FIG. 29 is a cross-sectional view of the selection transistor ST2. As illustrated in the drawing, while the selection transistor ST2-1 is formed in the memory pillar MP, the selection transistor ST2-2 is formed on a p-type well area 13. In other words, the gate insulating film 70 is formed on the well area 13, and the gate electrode 12 is disposed on the gate insulating film 70. In addition, inside the well area 13, an n-type impurity diffusion layer 71 functioning as a source area is disposed inside the well area 13. According to this configuration, for example, by using the diffusion layer 71 and the like, electric potential can be applied to a back gate of the transistor ST2-2.

In addition, in each exemplary embodiment of the present disclosure, (1) for example, in a case where the memory cell transistor MT can store data of two bits, threshold voltage are "Er", "A", "B", and "C" levels in order of lowest to highest threshold voltages, and the "Er" level is an erase state, a voltage applied to a word line selected for a read operation of the "A" level, for example, is between 0 V to 0.55 V. However, the applied voltage is not limited thereto but may be between any one of 0.1 V to 0.24 V, 0.21 V to 0.31 V, 0.31 V to 0.4 V, 0.4 V to 0.5 V, and 0.5 V to 0.55 V.

In addition, a voltage applied to a word line selected for a read operation of the "B" level, for example, is between 1.5 V to 2.3 V. However, the applied voltage is not limited thereto but may be between any one of 1.65 V to 1.8 V, 1.8 V to 1.95 V, 1.95 V to 2.1 V, and 2.1 V to 2.3 V.

A voltage applied to a word line selected for a read operation of the "C" level, for example, is between 3.0 V to 4.0 V. However, the applied voltage is not limited thereto but may be between any one of 3.0 V to 3.2 V, 3.2 V to 3.4 V, 3.4 V to 3.5 V, 3.5 V to 3.6 V, and 3.6 V to 4.0 V.

A time (tR) of a read operation, for example, may be between 25 μs to 38 μs, 38 μs to 70 μs, or 70 μs to 80 μs.

(2) A write operation includes a program operation and a verification operation. In a write operation, a voltage that is initially applied to a word line selected at the time of a program operation is, for example, between 13.7 V to 14.3 V. However, the applied voltage is not limited thereto but, for example, may be between any one of 13.7 V to 14.0 V and 14.0 V to 14.6 V.

The voltage that is initially applied to a selected word line when data is written into an odd-numbered word line and the voltage that is initially applied to a selected word line when data is written into an even-numbered word line may be changed.

When a program operation is performed in an incremental step pulse program (ISPP) type, the step-up voltage, for example, is about 0.5 V.

A voltage applied to a non-selected word line, for example, may be between 6.0 V to 7.3 V. However, the applied voltage is not limited thereto but, for example, may be between 7.3 V to 8.4 V or may be 6.0 V or less.

An applied pass voltage may be changed based on whether a non-selected word line is an odd-numbered word line or an even-numbered word line.

A time (tProg) of a write operation, for example, may be between 1700 μs to 1800 μs, 1800 μs to 1900 μs, or 1900 μs to 2000 μs.

(3) In an erase operation, a voltage that is initially applied to a well which is formed on an upper portion of the semiconductor substrate and above which the memory cell is disposed is, for example, between 12 V to 13.6 V. However, the applied voltage is not limited thereto but, for example, may be between 13.6 V to 14.8 V, 14.8 V to 19.0 V, 19.0 to 19.8 V, or 19.8 V to 21 V.

A time (tErase) of an erase operation may be, for example, between 3000 μs to 4000 μs, 4000 μs to 5000 μs, or 4000 μs to 9000 μs.

(4) Structure of Memory Cell

The charge storage layer disposed on the semiconductor substrate (e.g., silicon substrate) through a tunnel insulating film having a thickness of 4 to 10 nm is provided. This charge storage layer may have a stacking structure of an insulating film of SiN, SiON, or the like having a thickness of 2 to 3 nm and a polysilicon film having a thickness of 3 to 8 nm. In addition, metal such as Ru may be added to the polysilicon film. On the charge storage layer, an insulating film is provided. This insulating film, for example, includes a silicon oxide film having a thickness of 4 to 10 nm interposed between a lower layer high-k film having a thickness of 3 nm to 10 nm and an upper layer high-k film having a thickness of 3 nm to 10 nm. An example of the high-k film is HfO. In addition, the thickness of the silicon oxide film may be formed to be larger than the thickness of the high-k film. On the insulating film, a control electrode having a film thickness of 30 nm to 70 nm is formed through a material used for adjusting a work function having a film thickness of 3 nm to 10 nm. Here, the material used for adjusting a work function is a metal oxide film of TaO or the like or a metal nitride film of TaN or the like. W or the like may be used for the control electrode.

In addition, an air gap may be formed between memory cells.

Furthermore, in the embodiments described above, while the NAND flash memory is described as the semiconductor memory device as an example, the semiconductor memory device is not limited to the NAND flash memory. Thus, as the semiconductor memory, one of the other overall semiconductor memories may be applied, and furthermore, one of various memory devices other than the semiconductor memory may be applied.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a semiconductor substrate extending in a first direction and a second direction crossing the first direction;
   a plurality of odd word lines stacked in a third direction crossing the first and second directions, each of the odd word lines including:
      a plurality of first line portions extending in the first direction and being spaced at intervals in the second direction, and
      a first connection portion extending in the second direction and electrically connecting the first line portions;
   a plurality of even word lines stacked in the third direction, each of the even word lines including:
      a plurality of second line portions extending in the first direction and being spaced at intervals in the second direction, the first line portions and the second line portions being alternately arranged in the second direction, and
      a second connection portion extending in the second direction and electrically connecting the second line portions;
   a plurality of pillars that are each extending in the third direction to intersect gaps between the odd word lines and even word lines toward the semiconductor substrate, the pillars including:
      a first pillar intersecting one side of one of the second line portions in the second direction,
      a second pillar intersecting another side of the one of the second line portions in the second direction,
      a third pillar intersecting the one side of the one of the second line portions in the second direction,
      a fourth pillar intersecting the another side of the one of the second line portions in the second direction,
      a fifth pillar intersecting one side of another one of the second line portions in the second direction,
      a sixth pillar intersection another side of the another one of the second line portions in the second direction,
      a seventh pillar intersecting the one side of the another one of the second line portions in the second direction,
      an eighth pillar intersecting the another side of the another one of the second line portions in the second direction,
      the first to fourth pillars arranged in order along the first direction,
      the fifth to eighth pillars arranged in order along the first direction; and
   a plurality of bit lines that are each extending in parallel along the second direction and spaced each other in the first direction, the bit lines including:
      a first bit line connected to the first pillar,
      a second bit line connected to the fifth pillar,
      a third bit line connected to the second pillar,
      a fourth bit line connected to the sixth pillar,
      a fifth bit line connected to the third pillar,
      a sixth bit line connected to the seventh pillar,
      a seventh bit line connected to the fourth pillar, and
      an eighth bit line connected to the eighth pillar,
      the first to eighth bit lines being arranged in order along the first direction.

2. The semiconductor memory device according to claim 1, wherein, during a program operation:
   a first program voltage is applied to the second wiring,
   a first voltage is applied to the first, second, fifth, and sixth bit lines, and
   a second voltage is applied to the third, fourth, seventh, and eighth bit lines, the second voltage being different from the first voltage.

3. The semiconductor memory device according to claim 2, wherein the first voltage is greater than the second voltage.

4. The semiconductor memory device according to claim 1, further comprising:
   a plurality of select gate lines each extending in parallel along the first direction, spaced from each other in the second direction, and above the odd word lines and the even word lines in the third direction, each of the select gate lines being electrically connected to at least one other of the select gate lines.

5. The semiconductor memory device according to claim 1, further comprising:
   a first gap between the first pillar and the one of the second line portions;
   a second gap between the second pillar and the one of the second line portions;
   a third gap between the third pillar and the one of the second line portions; and
   a fourth gap between the fourth pillar and the one of the second line portions.

6. The semiconductor memory device according to claim 5, wherein
   a planar area of the first gap as viewed from the third direction is greater than a planar area of the second gap as viewed from the third direction, and
   a planar area of the third gap as viewed from the third direction is greater than a planar area of the fourth gap as viewed from the third direction.

7. The semiconductor memory device according to claim 6, wherein
   the planar area of the first gap and the planar area of the third gap are substantially the same, and the planar area of the second gap and the planar area of the fourth gap are substantially the same.

8. The semiconductor memory device according to claim 7, further comprising:
a fifth gap between the first pillar and the another one of the second line portions;
a sixth gap between the second pillar and the another one of the second line portions;
a seventh gap between the third pillar and the another one of the second line portions; and
an eighth gap between the fourth pillar and the another one of the second line portions, wherein
a planar area of the fifth gap as viewed from the third direction is greater than a planar area of the sixth gap as viewed from the third direction,
a planar area of the seventh gap as viewed from the third direction is greater than a planar area of the eighth gap as viewed from the third direction,
the planar area of the first gap, the planar area of the third gap, the planar area of the fifth gap, and the planar area of the seventh gap are substantially the same, and
the planar area of the second gap, the planar area of the fourth gap, the planar area of the sixth gap, and the planar area of the eighth gap are substantially the same.

9. The semiconductor memory device according to claim 5, wherein
a planar area of the first gap as viewed from the third direction is substantially equal to a planar area of the third gap as viewed from the third direction, and
a planar area of the second gap as viewed from the third direction is substantially equal to a planar area of the fourth gap as viewed from the third direction.

10. A method of performing a write operation on semiconductor memory device having a semiconductor substrate extending in a first direction and a second direction crossing the first direction; a plurality of odd word lines stacked in a third direction crossing the first and second directions, each of the odd word lines including: a plurality of first line portions extending in the first direction and being spaced at intervals in the second direction, and a first connection portion extending in the second direction and electrically connecting the first line portions; a plurality of even word lines stacked in the third direction, each of the even word lines including: a plurality of second line portions extending in the first direction and being spaced at intervals in the second direction, the first line portions and the second line portions being alternately arranged in the second direction, and a second connection portion extending in the second direction and electrically connecting the second line portions; a plurality of pillars that are each extending in the third direction to intersect gaps between the odd word lines and even word lines toward the semiconductor substrate, the pillars including: a first pillar intersecting one side of one of the second line portions in the second direction, a second pillar intersecting another side of the one of the second line portions in the second direction, a third pillar intersecting the one side of the one of the second line portions in the second direction, a fourth pillar intersecting the another side of the one of the second line portions in the second direction, a fifth pillar intersecting one side of another one of the second line portions in the second direction, a sixth pillar intersection another side of the another one of the second line portions in the second direction, a seventh pillar intersecting the one side of the another one of the second line portions in the second direction, an eighth pillar intersecting the another side of the another one of the second line portions in the second direction, the first to fourth pillars arranged in order along the first direction, the fifth to eighth pillars arranged in order along the first direction; and a plurality of bit lines that are each extending in parallel along the second direction and spaced each other in the first direction, the bit lines including: a first bit line connected to the first pillar, a second bit line connected to the fifth pillar, a third bit line connected to the second pillar, a fourth bit line connected to the sixth pillar, a fifth bit line connected to the third pillar, a sixth bit line connected to the seventh pillar, a seventh bit line connected to the fourth pillar, and an eighth bit line connected to the eighth pillar, the first to eighth bit lines being arranged in order along the first direction, said method comprising:
applying a first program voltage to the second wiring,
applying a first voltage to the first, second, fifth, and sixth bit lines, and
applying a second voltage to the third, fourth, seventh, and eighth bit lines, the second voltage being different from the first voltage.

11. The method according to claim 10, wherein the first voltage is greater than the second voltage.

12. The method according to claim 10, wherein the semiconductor memory device further comprises:
a plurality of select gate lines each extending in parallel along the first direction, spaced from each other in the second direction, and above the odd word lines and the even word lines in the third direction, each of the select gate lines being electrically connected to at least one other of the select gate lines.

13. The method according to claim 10, wherein the semiconductor memory device further comprises:
a first gap between the first pillar and the one of the second line portions;
a second gap between the second pillar and the one of the second line portions;
a third gap between the third pillar and the one of the second line portions; and
a fourth gap between the fourth pillar and the one of the second line portions.

14. The method according to claim 13, wherein
a planar area of the first gap as viewed from the third direction is greater than a planar area of the second gap as viewed from the third direction, and
a planar area of the third gap as viewed from the third direction is greater than a planar area of the fourth gap as viewed from the third direction.

15. The method according to claim 14, wherein
the planar area of the first gap and the planar area of the third gap are substantially the same, and
the planar area of the second gap and the planar area of the fourth gap are substantially the same.

16. The method according to claim 15, wherein the semiconductor memory device further comprises:
a fifth gap between the first pillar and the another one of the second line portions;
a sixth gap between the second pillar and the another one of the second line portions;
a seventh gap between the third pillar and the another one of the second line portions; and
an eighth gap between the fourth pillar and the another one of the second line portions, wherein
a planar area of the fifth gap as viewed from the third direction is greater than a planar area of the sixth gap as viewed from the third direction,
a planar area of the seventh gap as viewed from the third direction is greater than a planar area of the eighth gap as viewed from the third direction, the planar area of the first gap, the planar area of the third gap, the planar area of the fifth gap, and the planar area of the seventh gap are substantially the same, and the planar area of the second gap, the planar area of the fourth gap, the planar area of the sixth gap, and the planar area of the eighth gap are substantially the same.

* * * * *

UNITED STATES PATENT AND TRADEMARK OFFICE
CERTIFICATE OF CORRECTION

PATENT NO. : 11,164,888 B2
APPLICATION NO. : 17/030776
DATED : November 2, 2021
INVENTOR(S) : Takuya Futatsuyama and Go Shikata It is certified that error appears in the above-identified patent and that said Letters Patent is hereby corrected as shown below:

On the Title Page

Item (71) the Applicant "TOSHIBA MEMORY CORPORATION" should be replaced with "KIOXIA CORPORATION".

Signed and Sealed this
Fifteenth Day of November, 2022

Katherine Kelly Vidal
*Director of the United States Patent and Trademark Office*